(12) United States Patent
Gu et al.

(10) Patent No.: US 11,372,137 B2
(45) Date of Patent: Jun. 28, 2022

(54) TEXTURED COVER ASSEMBLIES FOR DISPLAY APPLICATIONS

(71) Applicant: Apple Inc., Cupertino, CA (US)

(72) Inventors: Mingxia Gu, Campbell, CA (US); Janos C. Keresztes, Cupertino, CA (US); Jun Qi, San Jose, CA (US); Jungwook Park, Cupertino, CA (US); Victor H. Yin, Cupertino, CA (US); Yanming Li, Santa Clara, CA (US)

(73) Assignee: APPLE INC., Cupertino, CA (US)

( * ) Notice: Subject to any disclaimer, the term of this patent is extended or adjusted under 35 U.S.C. 154(b) by 440 days.

(21) Appl. No.: 16/425,741

(22) Filed: May 29, 2019

(65) Prior Publication Data

US 2020/0379143 A1    Dec. 3, 2020

(51) Int. Cl.
| G02B 1/11 | (2015.01) |
| H05K 5/00 | (2006.01) |
| G02B 5/18 | (2006.01) |
| G02B 5/02 | (2006.01) |
| H05K 5/03 | (2006.01) |

(52) U.S. Cl.
CPC .............. *G02B 1/11* (2013.01); *G02B 5/0215* (2013.01); *G02B 5/1814* (2013.01); *H05K 5/0017* (2013.01); *H05K 5/03* (2013.01)

(58) Field of Classification Search
CPC ...... G02B 1/11; G02B 5/1814; G02B 5/0215; G02B 1/18; G02B 1/118; G02B 1/116; G02B 1/113; H05K 5/0017; H05K 5/03; H05K 5/0239; H05K 5/0243; G06F 1/1601; C03C 17/22; C03C 2217/73
See application file for complete search history.

(56) References Cited

U.S. PATENT DOCUMENTS

| 4,633,323 | A | 12/1986 | Haberkern et al. |
| 6,068,891 | A | 5/2000 | O'Dell et al. |
| 6,677,703 | B2 | 1/2004 | Ito et al. |
| 7,297,386 | B2 | 11/2007 | Suzuki et al. |
| 7,646,143 | B2 | 1/2010 | Kimura et al. |
| 8,092,911 | B2 | 1/2012 | Sakoske et al. |
| 8,106,787 | B2 | 1/2012 | Nurmi |
| 8,213,085 | B2 | 7/2012 | Liu et al. |
| 8,553,333 | B2 | 10/2013 | Chang et al. |
| 8,576,561 | B2 | 11/2013 | Myers et al. |

(Continued)

FOREIGN PATENT DOCUMENTS

| CN | 101712102 | 5/2010 |
| CN | 107683055 | 9/2012 |

(Continued)

OTHER PUBLICATIONS

Hedayati et al., Antireflective Coatings: Conventional Stacking Layers and Ultrathin Plasmonic Metasurfaces, A Mini-Review, Materials, vol. 9, No. 497, 2016.

(Continued)

*Primary Examiner* — Kimberly N. Kakalec

(74) *Attorney, Agent, or Firm* — Brownstein Hyatt Farber Schreck, LLP

(57) ABSTRACT

Textured cover assemblies for electronic devices are disclosed. The textured cover assemblies may be placed over a display and may provide anti-glare and anti-reflection properties to the electronic device.

20 Claims, 15 Drawing Sheets

(56) References Cited

U.S. PATENT DOCUMENTS

| | | | |
|---|---|---|---|
| 8,603,372 B2 | 12/2013 | Tanaka et al. | |
| 8,681,113 B1 | 3/2014 | Wu et al. | |
| 8,771,532 B2 | 7/2014 | Carlson et al. | |
| 8,872,295 B2 | 10/2014 | Hermans et al. | |
| 8,896,802 B2 | 11/2014 | Yoneyama et al. | |
| 8,953,083 B2 | 2/2015 | Hedge | |
| 9,017,566 B2 | 4/2015 | Lander et al. | |
| 9,034,166 B2 | 5/2015 | Tatebe et al. | |
| 9,154,678 B2 | 10/2015 | Kwong et al. | |
| 9,239,594 B2 | 1/2016 | Lee et al. | |
| 9,240,498 B2 | 1/2016 | Fujita et al. | |
| 9,262,002 B2 | 2/2016 | Momeyer et al. | |
| 9,377,603 B1 | 6/2016 | Cheng et al. | |
| 9,448,713 B2 | 9/2016 | Cruz-Hernandez et al. | |
| 9,554,482 B2 | 1/2017 | Wilson et al. | |
| 9,644,281 B2 | 5/2017 | Tatebe et al. | |
| 9,658,500 B2 | 5/2017 | Iwamoto | |
| 9,720,141 B1* | 8/2017 | Cheng | G02B 1/18 |
| 9,732,237 B2 | 8/2017 | Sugamoto et al. | |
| 9,745,221 B2 | 8/2017 | Ehrensperger et al. | |
| 9,862,124 B2 | 1/2018 | Radcliffe et al. | |
| 9,880,327 B2 | 1/2018 | Park et al. | |
| 9,938,186 B2 | 4/2018 | Moll et al. | |
| 9,961,337 B2 | 5/2018 | Stroetmann | |
| 10,013,020 B2 | 7/2018 | Hong et al. | |
| 10,043,052 B2 | 8/2018 | Wickboldt et al. | |
| 10,171,636 B2 | 1/2019 | Yeo et al. | |
| 10,214,445 B2 | 2/2019 | Hart et al. | |
| 10,298,824 B2 | 5/2019 | Lee et al. | |
| 10,442,151 B2 | 10/2019 | Ozeki et al. | |
| 10,647,032 B2 | 5/2020 | Radcliffe et al. | |
| 10,676,393 B2 | 6/2020 | Weber et al. | |
| 10,781,135 B2 | 9/2020 | Weber et al. | |
| 10,827,635 B1 | 11/2020 | Limarga et al. | |
| 10,843,439 B2 | 11/2020 | Gulati et al. | |
| 10,866,616 B2 | 12/2020 | Seo et al. | |
| 10,948,633 B2 | 3/2021 | Murakami et al. | |
| 2002/0127565 A1 | 9/2002 | Cunningham | |
| 2003/0011315 A1 | 1/2003 | Ito et al. | |
| 2005/0266250 A1 | 12/2005 | Hayakawa | |
| 2006/0024508 A1 | 2/2006 | D'Urso et al. | |
| 2006/0034042 A1 | 2/2006 | Hisano et al. | |
| 2007/0195419 A1 | 8/2007 | Tsuda et al. | |
| 2008/0055728 A1* | 3/2008 | Tanaka | G02B 1/118 |
| | | | 359/584 |
| 2009/0257207 A1 | 10/2009 | Wang et al. | |
| 2012/0127755 A1 | 5/2012 | Shiau et al. | |
| 2012/0194974 A1 | 8/2012 | Weber et al. | |
| 2012/0218640 A1 | 8/2012 | Gollier et al. | |
| 2012/0274565 A1 | 11/2012 | Moser et al. | |
| 2013/0026593 A1 | 1/2013 | Hermans et al. | |
| 2013/0235462 A1 | 9/2013 | Haas | |
| 2013/0273324 A1 | 10/2013 | Moll et al. | |
| 2014/0035869 A1 | 2/2014 | Yun et al. | |
| 2014/0063609 A1 | 3/2014 | Iwata et al. | |
| 2014/0098075 A1 | 4/2014 | Kwak et al. | |
| 2014/0106127 A1 | 4/2014 | Lyons et al. | |
| 2014/0327643 A1 | 11/2014 | Sun et al. | |
| 2015/0090689 A1 | 4/2015 | Guilfoyle et al. | |
| 2016/0154435 A1 | 6/2016 | Yanagisawa et al. | |
| 2016/0188181 A1 | 6/2016 | Smith et al. | |
| 2016/0224822 A1 | 8/2016 | Hasegawa et al. | |
| 2016/0283014 A1 | 9/2016 | Rider et al. | |
| 2016/0306390 A1 | 10/2016 | Vertegaal et al. | |
| 2016/0370586 A1* | 12/2016 | Saenger Nayver | G02B 27/0101 |
| 2017/0026553 A1 | 1/2017 | Lee et al. | |
| 2017/0058130 A1 | 3/2017 | Addleman et al. | |
| 2017/0276618 A1 | 9/2017 | Takagi | |
| 2017/0285227 A1* | 10/2017 | Chen | G02B 1/12 |
| 2017/0308234 A1 | 10/2017 | Li et al. | |
| 2018/0042131 A1 | 2/2018 | Liu et al. | |
| 2018/0086662 A1 | 3/2018 | Luzzato et al. | |
| 2018/0162091 A1 | 6/2018 | Takeda et al. | |
| 2018/0162768 A1 | 6/2018 | Boek et al. | |
| 2018/0185875 A1* | 7/2018 | Murakami | C03C 21/002 |
| 2018/0215657 A1 | 8/2018 | Jin et al. | |
| 2018/0282201 A1 | 10/2018 | Hancock et al. | |
| 2019/0032237 A1 | 1/2019 | Kim et al. | |
| 2019/0037690 A1 | 1/2019 | Wilson et al. | |
| 2019/0155339 A1 | 5/2019 | Fenton et al. | |
| 2019/0230204 A1 | 7/2019 | Zhang | |
| 2019/0236887 A1 | 8/2019 | Rich et al. | |
| 2019/0241455 A1 | 8/2019 | Sweney et al. | |
| 2019/0246018 A1 | 8/2019 | Rho et al. | |
| 2019/0256410 A1* | 8/2019 | Isshiki | C03C 15/00 |
| 2019/0331940 A1 | 10/2019 | Poole et al. | |
| 2020/0014780 A1 | 1/2020 | Jones | |
| 2020/0026327 A1 | 1/2020 | Hendren et al. | |
| 2020/0189966 A1 | 6/2020 | Lee et al. | |
| 2020/0199020 A1 | 6/2020 | Hatano et al. | |
| 2020/0301527 A1 | 9/2020 | Poole et al. | |
| 2020/0304616 A1 | 9/2020 | Jones | |
| 2020/0389991 A1 | 12/2020 | Shannon et al. | |
| 2021/0014992 A1 | 1/2021 | Limarga et al. | |
| 2021/0378117 A1 | 12/2021 | Shannon et al. | |
| 2021/0397220 A1 | 12/2021 | Hendren et al. | |
| 2022/0071039 A1 | 3/2022 | Limarga et al. | |

FOREIGN PATENT DOCUMENTS

| | | | |
|---|---|---|---|
| CN | 203013800 | 6/2013 | |
| CN | 103502166 | 1/2014 | |
| CN | 203406929 | 1/2014 | |
| CN | 104024929 | 9/2014 | |
| CN | 104583147 | 4/2015 | |
| CN | 105283322 | 1/2016 | |
| CN | 107438494 | 12/2017 | |
| CN | 207070526 | 3/2018 | |
| CN | 107911964 | 4/2018 | |
| CN | 107924002 | 4/2018 | |
| CN | 10832510 | 10/2018 | |
| CN | 207992872 | 10/2018 | |
| CN | 109202296 | 1/2019 | |
| CN | 208433428 | 1/2019 | |
| CN | 208461858 | 2/2019 | |
| CN | 109547679 | 3/2019 | |
| CN | 109640557 | 4/2019 | |
| DE | 10223165 | 12/2003 | |
| EP | 3454541 | 3/2019 | |
| JP | 2011510904 | 4/2011 | |
| JP | 2013242725 | 12/2013 | |
| JP | 2016045824 | 4/2016 | |
| JP | 2017508178 | 3/2017 | |
| JP | 2018506851 | 3/2018 | |
| KR | 20130127842 | 11/2013 | |
| KR | 20160145081 | 12/2016 | |
| KR | 20170076779 | 7/2017 | |
| KR | 20180018782 | 2/2018 | |
| TW | 201910882 | 3/2019 | |
| WO | WO2014/011328 | 1/2014 | |
| WO | WO2014/012003 | 1/2014 | |
| WO | WO2015/191949 | 12/2015 | |
| WO | WO2016/088983 | 6/2016 | |
| WO | WO2016/196615 | 12/2016 | |
| WO | WO2017/038868 | 3/2017 | |
| WO | WO-2017038868 A1 * | 3/2017 | B05D 1/06 |
| WO | WO2019/027675 | 2/2019 | |

OTHER PUBLICATIONS

Qi et al., "Simple Approach to Wafer-Scale Self-Cleaning Antireflective Silicon Surfaces," American Chemical Society, State Key Laboratory of Supramolecular Structure and Materials, College of Chemistry, Jilin University, Changchun 130012, P.R. China, 2009.

Tan et al., "Broadband antireflection film with moth-eye-like structure for flexible display applications," Optica, vol. 4, No. 7, pp. 678-683, Jul. 2017.

Author Unknown, "LG's Future Display Technology Will Blow You Away," Techno Source, https://www.youtube.com/watch?v=qlRjytgNuhM, 2 pages, May 2, 2017.

(56) References Cited

OTHER PUBLICATIONS

Ben-Yakar et al., "Femtosecond laser ablation properties of borosilicate glass," Journal of Applied Physics, vol. 96, No. 9, 8 pages, Nov. 1, 2004.
Seth, Radhika, "A Fresh New Look at the Computer," https://www.yankodesign.com/2009/02/06/a-fresh-new-look-at-the-computer, 1 page, Feb. 6, 2009.
Wimmer, "Curve: Revisiting the Digital Desk," NordiCHI '10: Proceedings of the 6th Nordic Conference on Human-Computer Interaction: Extending Boundaries, https://doi.org/10.1145/1868914.1868977, http://www.mmi.ifi.lmu.de/pubdb/publications/pub/wimmer2010Curve/wimmer2010Curve.pdf, https://dl.acm.org/doi/10.1145/1868914.1868977, pp. 561-570, Oct. 2010.

* cited by examiner

TEXTURED COVER ASSEMBLIES FOR DISPLAY APPLICATIONS

FIELD

The described embodiments relate generally to textured enclosure components for electronic devices. More particularly, the present embodiments relate to textured cover assemblies for use over displays and having anti-glare and anti-reflection properties.

BACKGROUND

Electronic devices may include a glass cover member over a display, camera, or other device component. In some cases, a texture or an anti-reflection coating may be applied to the glass cover member to provide particular optical effects.

SUMMARY

The disclosure provides textured cover assemblies which can provide both anti-glare and anti-reflection properties. The textured cover assemblies may be included in enclosures for electronic devices. Electronic devices including the textured cover assemblies are also disclosed herein.

When provided over a display, a textured cover assembly may improve the visibility of output from the display by reducing the brightness and distinctness of images formed by reflection from the cover. The textured cover assembly may also limit sparkling effects in order to further improve the readability of output from the display.

The disclosure provides an electronic device comprising a housing, a display positioned at least partially within the housing, and a cover assembly positioned over the display and coupled to the housing. The cover assembly has a textured region and includes a glass cover member having a surface defining hills and valleys configured to diffusely reflect visible light from the textured region. The cover assembly further includes a transparent inorganic coating covering the hills and the valleys and configured to produce destructive interference between the visible light reflected from the transparent inorganic coating and the visible light reflected from at least a portion of the hills and at least a portion of the valleys.

In addition, the disclosure provides an electronic device comprising a housing, a cover assembly coupled to the housing and defining an exterior surface, and a display positioned below the cover assembly and configured to display a graphical output that is visible through the surface features and the coating. The cover assembly comprises a glass cover member defining a set of surface features, the set of surface features having a root mean square height greater than zero and less than about 2 microns and an average pitch greater than the root mean square height and less than about 20 microns. The cover assembly further comprises a coating covering the surface features and comprising a plurality of inorganic dielectric layers. The coating may be configured to cause destructive interference of between light reflected from the coating and light reflected from the glass cover member. In some embodiments, the coating may cause the exterior surface of the cover assembly to have a neutral reflectance over a visible spectrum of light.

The disclosure also provides an electronic device comprising a housing at least partially defining an interior volume of the electronic device, a display positioned at least partially within the interior volume, and a cover assembly positioned over the display and coupled to the housing. The cover assembly includes a glass cover member and an anti-reflection coating conforming to the protrusions and the substrate surface and comprising an inorganic dielectric material. The glass cover member defines a substrate surface, a set of protrusions extending outwardly from the substrate surface and arranged such that at least two adjacent protrusions of the set of protrusions are set apart from one another along the substrate surface, each protrusion of the set of protrusions having a width between about 1 micron to about 25 microns and a height greater than zero and less than about 2 microns.

BRIEF DESCRIPTION OF THE DRAWINGS

The disclosure will be readily understood by the following detailed description in conjunction with the accompanying drawings, wherein like reference numerals designate like elements.

Figure 1:
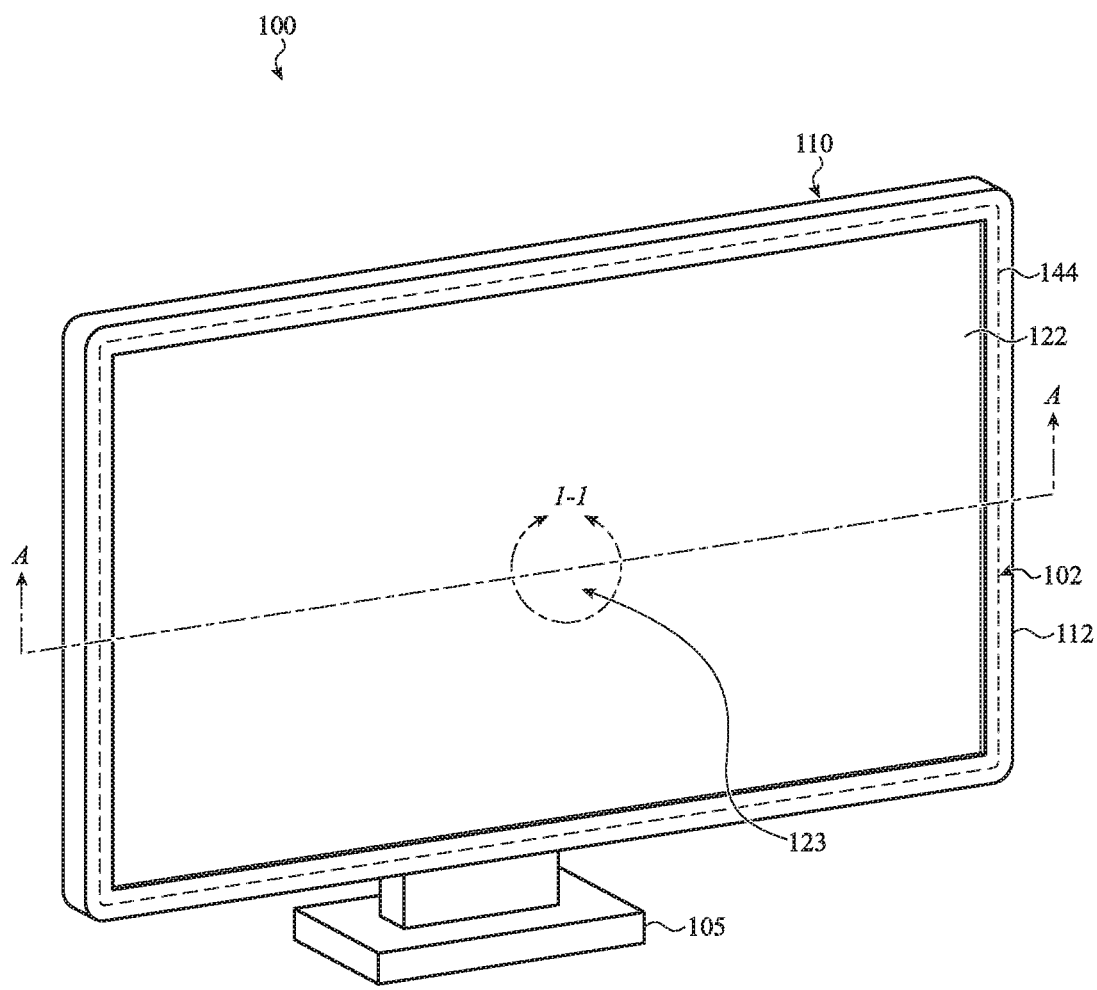
FIG. 1 shows a front view of an electronic device.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred implementation. To the contrary, the described embodiments are intended to cover alternatives, modifications, and equivalents as can be included within the spirit and scope of the disclosure and as defined by the appended claims.

The following disclosure relates to a textured cover assembly which provides both anti-glare and anti-reflection properties. As a result, the textured cover assembly may have a high ambient contrast ratio without unduly reducing the distinctness or clarity of transmitted images. Enclosures and electronic devices including the textured cover assemblies are also disclosed herein.

The cover assembly may have a textured region which diffuses or scatters light reflected from an external lighting source in order to provide an anti-glare property. The textured region of the cover assembly may also include an anti-reflection layer which causes destructive interference of light in order to provide an anti-reflection property. A textured region including an anti-reflection layer may be configured for use with a high resolution display, such as a display having a resolution of 4K or higher.

The textured cover assembly may comprise a glass cover member defining a set of surface features. For example, the set of surface features may be configured to diffusely reflect incident light. The surface features may define any of a range of shapes or configuration which can diffuse or scatter incident light. For example, the surface features may define protrusions and/or recesses. The surface features may also define set of hills and valleys. The surface features may partially define surface structures of the textured region, as described in further detail below.

The textured cover assembly may further comprise an anti-reflection coating covering at least some of surface features. In some embodiments, the anti-reflection coating may be configured to produce destructive interference of light reflected from the textured region of the cover assembly and thereby provide an anti-reflection effect. In additional embodiments, the anti-reflection coating may be configured to produce a gradient in the index of refraction.

The reflectance spectrum of the anti-reflection coating may be affected by the underlying surface features. The anti-reflection coatings described herein may therefore be configured to provide a desired reflectance spectrum when applied over the surface features. In some cases, the anti-reflection coating may provide a neutral reflectance over the visible spectrum of light. The anti-reflection coating may comprise an inorganic dielectric material, such as a transparent inorganic material.

In some embodiments the textured region of the cover assembly may also be configured to limit sparkling effects when the textured region is provided over a display. For example, at least some of the surface features of the glass cover member may be sized to limit diffraction of light from the display. In some cases, a diffractive layer may be provided between the display and the cover assembly to further limit sparkling effects, as explained in greater detail below.

These and other embodiments are discussed below with reference to FIGS. 1-13. However, those skilled in the art will readily appreciate that the detailed description given herein with respect to these figures is for explanatory purposes only and should not be construed as limiting.

FIG. 1 shows a front view of an electronic device including a textured cover assembly. The electronic device 100 may be a monitor for a computing device. In additional embodiments, the electronic device 100 may be a television, a media player, or a display portion of a television or media player. The electronic device 100 may also be a notebook computing device (e.g., a notebook), a tablet computing device (e.g., a tablet), a mobile telephone (also referred to as a mobile phone), a portable media player, a wearable device, or another type of portable electronic device. The electronic device 100 may also be a desktop computer system, computer component, input device, appliance, or virtually any other type of electronic product or device component.

FIG. 1 shows a front view of the electronic device 100. As shown in FIG. 1, the electronic device 100 has an enclosure 110 including a cover assembly 122 which includes a textured region 123. A cover assembly including a textured region, such as the cover assembly 122, may also be referred to as a textured cover assembly. The cover assembly 122 may be positioned over a display 144 and the textured region 123 of the cover assembly 122 may also be positioned over the display 144. The textured region 123 of the cover assembly 122 may define a transparent window region or window portion through which graphical output from the display may be viewed. The enclosure 110 may at least partially surround the display 144 (indicated by a dashed line in FIG. 1).

As described in further detail with respect to FIGS. 2B-6, the cover assembly 122 may be formed from multiple layers. The multiple layers may include one or more glass layers, polymer layers, anti-reflection layers, smudge-resistant layers, and the like. In some embodiments, the cover assembly includes a glass cover member (e.g., glass cover member 252 of FIG. 2B). The cover assembly may include a single glass cover member, a laminate comprising multiple glass cover members, or a laminate comprising a glass cover member and a polymer layer.

As described in further detail with respect to FIGS. 2B-6, the glass cover member may define a textured surface, such as a textured exterior surface. The textured exterior surface of the glass cover member may be configured to diffusely reflect light incident on the textured exterior surface. An anti-reflection coating may cover or substantially cover the textured exterior surface and may be configured to produce destructive interference of light reflected from the textured region 123 of the cover assembly 122.

Typical cover assemblies herein are thin, typically less than 5 mm in thickness, and more typically less than 3 mm in thickness. In some aspects, a glass cover member of a cover assembly can have a thickness from about 0.1 mm to 2 mm, from 0.5 mm to 2 mm, or from 0.2 mm to 1 mm.

The glass cover member may be chemically strengthened through ion exchange. During the ion exchange, ions present in the glass material may be exchanged for larger ions to form a compressive stress layer extending from the textured exterior surface of the glass cover member. The additional description of chemical strengthening provided with respect to FIG. 12C is generally applicable to the glass cover members described herein.

Figure 2A:
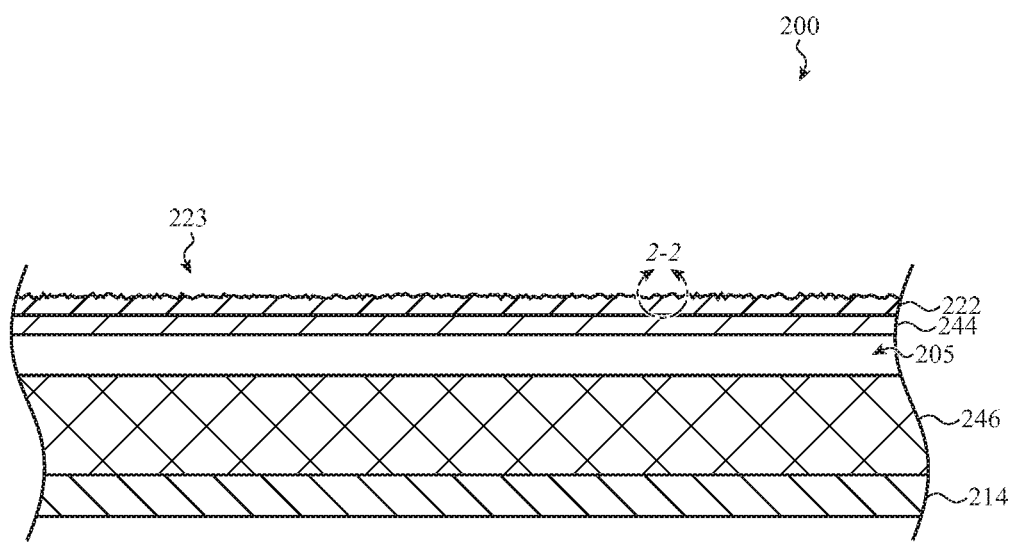
FIG. 2A shows an example of a cross-section view of an electronic device.

As shown in FIG. 1, the enclosure 110 also includes a housing member 112. The cover assembly 122 may be coupled to the housing member 112, such as with a fastener or fastening technique. For example, the cover assembly 122 may be coupled to the housing member 112 using an adhesive, an engagement feature, as fastener, or a combination of any of these. As shown in FIG. 1, the cover assembly 122 may define a first portion and the housing member 112 may define a second portion of a front surface 102 of the electronic device 100. The electronic device may also include a side surface and a rear surface; in some embodiments, the side surface and the rear surface are defined by an additional housing member, as shown in FIG. 2A. The electronic device 100 may also include a stand 105.

In additional embodiments, cover assemblies as described herein may be included in an all glass or a multi-faceted glass enclosure. In such embodiments, a cover assembly may define one or more surfaces of the enclosure, such as a front surface and a side surface, or a front surface, a side surface and a rear surface.

FIG. 2A shows an example of a cross-section view of an electronic device 200, which may be an example of the electronic device of FIG. 1. The cross-section may be taken along A-A in detail area 1-1. As shown in FIG. 2A, the cover assembly 222 has a textured region 223. A display 244 is provided below the cover assembly 222. The electronic device 200 further includes a housing component 214, which may define a rear surface of electronic device 200.

Additional components, schematically indicated by the element 246, may also be included within the interior volume 205 of the electronic device 200. These additional components may comprise one or more of a processing unit, control circuitry, memory, an input/output device, a power source, a network communication interface, a camera or other accessory, and a sensor. The electronic device 200 may include an optional touch sensor between the display and the cover assembly, as discussed in more detail with respect to FIG. 4. The touch sensor may be configured to detect or measure a location of a touch along the exterior surface of the cover assembly. Components of a sample electronic device are discussed in more detail below with respect to FIG. 13.

Figure 2B:
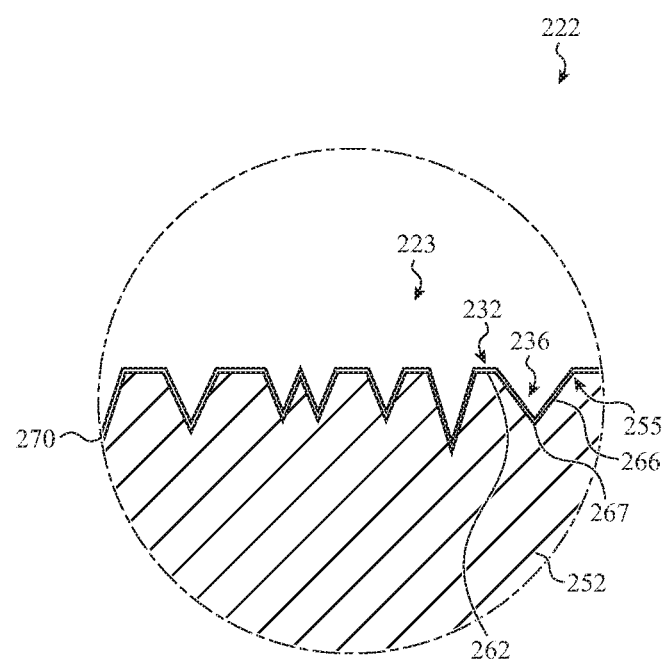
FIG. 2B shows an example detail view of the cover assembly of FIG. 2A.

FIG. 2B shows an example detail view of the cover assembly of FIG. 2A (e.g., in detail area 2-2). As shown in FIG. 2B, the cover assembly 222 includes a plurality of surface structures (e.g., the surface features 232 and 236) which contribute to the texture of textured region 223. Each of the surface structures 232 and 236 is partly defined by a corresponding surface feature, such as surface features 262 and 266 of the glass cover member 252. In addition, each of the surface structures 232 and 236 is partly defined by an anti-reflection coating 270. When a smudge-resistant coating is applied on the anti-reflection coating 270, the surface structures 232 and 236 may further include the smudge-resistant coating.

As shown in FIG. 2B, the anti-reflection coating 270 may be thin relative to the surface features 262, 266 of the glass cover member 252. In addition, the anti-reflection coating 270 may have a thickness that is substantially uniform. For example, the variation in the thickness of the anti-reflection coating 270 may be less than or equal to about 10%, less than or equal to about 5%, less than or equal to about 3%, or less than or equal to about 2%. The variation in the thickness of the anti-reflection coating over different types of surface features, such as the recessed feature 266 and the feature 262, may also be less than or equal to about 10%, less than or equal to about 5%, less than or equal to about 3%, or less than or equal to about 2%. For example, the anti-reflection coating 270 may have a thickness from about 100 nm to about 1.0 micron or from about 100 nm to about 500 nm.

As shown in FIG. 2B, the glass cover member 252 defines a set of surface features (e.g., the surface features 262 and 266) along an exterior surface 255. The surface structures of textured region 232, such as the surface structures 232 and 236, may have a shape generally corresponding to that of their corresponding surface features.

The surface features of the set of surface features may define any of a range of shapes or configurations which can diffuse (alternately, scatter) incident light. In some cases, adjacent surface features may be separated by a substantially level portion (e.g., such as the surface feature 232 of FIG. 2B). A substantially level portion may also be referred to as a substantially flat or substantially planar portion. As examples, a variation in the height of a substantially level portion of a surface may be less than or equal to about 10%, less than or equal to about 5%, less than or equal to about 3%, or less than or equal to about 2%. The surface features may have a variety of shapes, such as rounded or angular features. As examples, the surface features may define a circular, oval, polygonal, rectangular, or irregular surface contour. Furthermore, the surface features may define protrusions or recesses and may have any suitable shape and may be pyramidal, conical, cylindrical, arched, have a curved upper surface or a frustum of a shape such as a cone, and so on. In some embodiments, the surface features and surface structures may be viewed as defining hills and valleys. The hills and valleys may be defined using areal texture analysis techniques as described in more detail below.

As shown in FIG. 2B, the surface feature 266 is a recessed feature and the surface feature 262 may be regarded as defining a level (flat) portion between the surface features 266. The surface features 262 and 266 may also be viewed as defining hills and valleys. From this point of view, the surface feature 262 may define at least a portion of a hill (with a flat top) and the surface feature 266 may define at least a portion of a valley. Surface features in the form of recesses or valleys may define minimum points, such as the point 267 of recessed surface feature 266. Similarly, surface features in the form of protrusions or hills may define a maximum point, also referred to herein as a peak (for example, the point 563 of FIG. 5). A set of hills may define a set of peaks.

As previously discussed, the shape of the surface structures may generally correspond to the shape of the surface features. For example, the surface structure 232 may define a level portion between adjacent surface structures 236 and the surface structure 236 may define a recessed structure.

Figure 7:
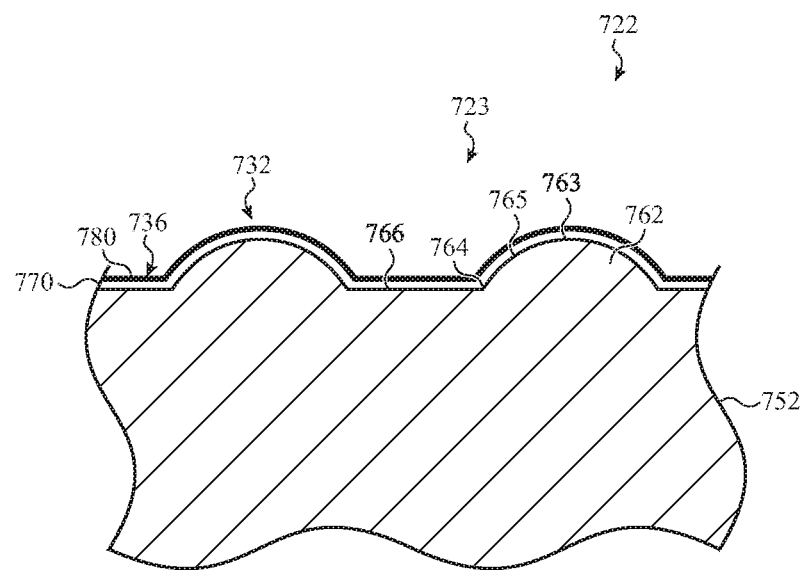
FIG. 7 shows a cross-section view of an additional example of a cover assembly.
Figure 8:
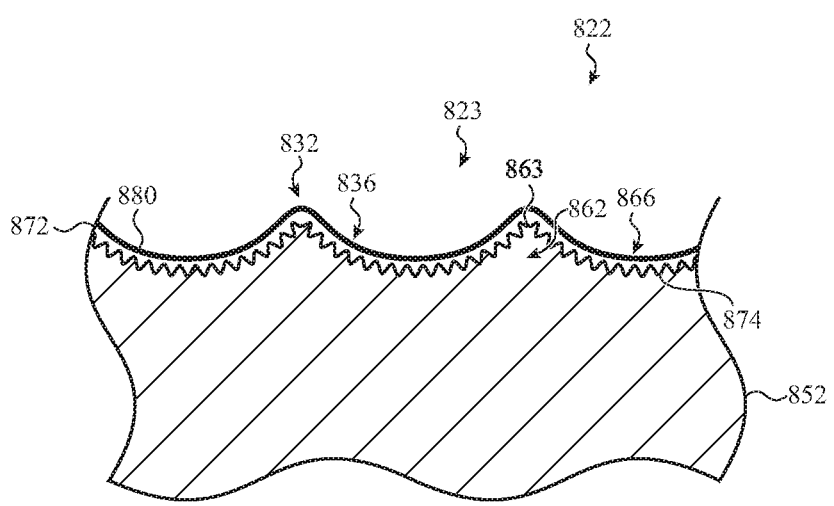
FIG. 8 shows a cross-section view of a further example of a cover assembly.

Further, the surface features may include two sets of differently sized features, the two sets providing different optical properties to the cover assembly, as shown in FIG. 8. FIGS. 5-11 show additional examples of surface feature shapes. Although some of these figures may illustrate a regular spacing between surface features, this is not intended to be limiting, and in additional embodiments the surface features may be non-uniformly spaced.

The anti-reflection coating 270 may be configured to produce destructive interference of light reflected from the textured region 223. For example, light reflected from the anti-reflection coating and light reflected from the exterior surface of the surface features (e.g., the surface features 262 and 266) may destructively interfere, thereby reducing the amount of light reflected from the textured region 223. The amount of visible light reflected from the textured region 223 may be less than or equal to about 10%, less than or equal to about 5%, less than or equal to about 2.5%, or less than or equal to about 1% integrated across the visible wavelength range of light (also referred to as the visible spectrum).

The anti-reflection coating 270 at least partially covers the surface features of the glass cover member. The anti-reflection coating 270 may substantially cover the surface features, such as covering at least about 75%, 80%, 85%, 90%, 95%, or 98% of the exterior surface of the surface features. In addition, the anti-reflection coating 270 may cover at least a subset of a set of surface features. The anti-reflection coating may be in direct contact with at least a subset of the surface features.

The reflectance spectrum of the anti-reflection coating may be affected by the underlying surface features. The anti-reflection coatings described herein may therefore be configured to provide a desired reflectance spectrum when applied over the surface features. In some cases, the anti-reflection coating may provide a neutral reflectance over the visible spectrum. For example, the anti-reflection coating may reduce reflection over a sufficiently broad range of wavelengths that the color of the anti-reflection appears neutral (e.g., substantially achromatic).

The anti-reflection coating may comprise an inorganic dielectric material. For example, transparent inorganic coating may comprise a metal oxide or a metal nitride. Anti-reflection coating compositions are described in greater detail with respect to FIG. 12D and that discussion is generally applicable herein. The anti-reflection coating may be a multilayer coating. For example, a multilayer anti-reflection coating may have two, three, four, five, six, or more layers. In some embodiments, the anti-reflection coating includes a first layer comprising a first inorganic dielectric material and a second layer comprising a second inorganic dielectric material.

The anti-reflection coating may have an index of refraction different than an index of refraction of the glass cover member. For example, the anti-reflection coating may include an inorganic dielectric material that has an index of refraction less than an index of refraction of the glass cover member. The anti-reflection coating may include different inorganic dielectric materials. A first inorganic dielectric material may have an index of refraction less than an index of refraction of the glass cover member and a second inorganic dielectric material may have an index of refraction greater than the index of refraction of the glass cover member.

Various surface texture parameters may be used to describe the surface structures (e.g., the surface structures 232 and 236) of the textured region 223, the surface features (e.g., the surface features 262 and 266) of the glass cover member 252, or both. For example, texture parameters of the surface features of the glass cover may be determined before the anti-reflection coating is disposed on the surface features. Texture parameters of the surface structures of the textured region 232 may be determined after the anti-reflection coating is disposed on the surface.

Surface texture parameters include areal surface texture parameters such as amplitude parameters, spatial parameters, and hybrid parameters. Surface filtering may be used to exclude surface noise and/or surface waviness before determining the surface texture parameters. In addition, a segmentation technique may be used to determine feature parameters such as the maximum diameter, the minimum diameter, the area, and the perimeter. These parameters may be calculated on the basis of the feature shape as projected on to the reference surface (e.g., a reference plane). Mean values may be determined for a given class of features (e.g., hills or valleys). Surface texture parameters and methods for determining these parameters (including filtering and segmentation) are described in more detail in International Organization for Standardization (ISO) standard 25178 (Geometric Product Specifications (GPS)—Surface texture: Areal). These surface texture parameters may be measured using commercially available equipment.

For example, the surface structures (e.g., the surface structures 232 and 236) of the cover assembly 222 and surface features (e.g., the surface features 262 and 266) of the glass cover member 252 may be characterized, in part, by the heights of the surface structures and/or surface features. The height may be measured with respect to a reference surface, such as the arithmetical mean of the surface. The heights of the surface structures and/or surface features may not be uniform, so that the surface structures and/or surface features have a distribution of heights. The magnitude of the heights of the surface structures and/or surface features may fall in the range from zero to about 5 microns, zero to about 2.5 microns, from zero to about 2 microns, from zero to about 1.5 microns, or from zero to about 1 micron. The surface structures and/or surface features may be characterized by the root mean square height Sq or the arithmetic mean height Sa of the surface. The root mean square height of the surface may be greater than zero and less than about 5 microns, greater than zero and less than about 2.5 microns, greater than zero and less than about 2 microns, greater than zero and less than about 1.5 microns, greater than zero and less than about 1 micron, or from about 0.25 microns to about 1.0 micron. In some embodiments, a thickness of the anti-reflection coating may be smaller than a height of the surface structures and/or surface features, such as the root mean square height of the surface features.

In addition, the surface structures and/or surface features may be characterized by lateral parameters, such as the distance between peaks. The spacing between peaks may not be uniform, so that there is a distribution of spacings between peaks. For example, the spacing between peaks may fall in the range from about 1 micron to about 20 microns. The average (mean) distance or spacing between peaks may be referred to as the average pitch or mean pitch. The average or mean pitch may be from about 1 micron to about 25 microns, from about 1 micron to about 20 microns, from about 2.5 microns to about 10 microns, from about 5 microns to about 15 microns, or from about 5 microns to about 25 microns.

The surface structures and/or surface features may also be characterized by their lateral size. For example, the surface features may be characterized by a maximum lateral (or linear) size and a minimum lateral (or linear size). A protruding surface structure and/or surface feature may be characterized by a lateral size at the base of the surface structure and/or surface feature, also referred to as a lateral base size. A recessed surface structure and/or surface feature may be characterized by a lateral size at the entrance to the recessed surface structure and/or surface features. A group of surface structures and/or features may have a distribution of lateral base sizes and/or lateral entrance sizes. For example, the range of lateral base sizes or entrance sizes may fall in the range from about 0.5 microns to about 25 microns or from about 1 micron to about 20 microns. Similarly, the maximum lateral size of a recessed feature may fall in the range from about 0.5 microns to about 25 microns or from about 1 micron to about 20 microns.

The lateral dimension and/or spacing of the surface structures and/or surface features may be configured for use with a high resolution display, such as a display having a resolution of 4K or greater. For example, the average pitch between adjacent peaks of the surface structures and/or surface features may be from about 5 microns to about 25 microns when the cover assembly is used with a high resolution display.

In some embodiments, the lateral dimension and/or spacing of the surface structures and/or surface features may be configured to be smaller than a pixel size of the display. Typically the display 244 comprises a plurality of pixels. The pixels may have a size, such as a lateral dimension, selected for the intended application. For example, the size of the pixels may be about 400 microns or less, about 300 microns or less, about 250 microns or less, or about 100 microns or less. The pixels may also have subpixels, such as single color regions. The size of the subpixels may be about 100 microns or less, about 75 microns or less, about 50 microns or less, or about 25 microns or less.

The display may be a liquid-crystal display (LCD), light-emitting diode (LED) display, a LED-backlit LCD display, organic light-emitting diode (OLED) display, an active layer organic light-emitting diode (AMOLED) display, and the like. The display may be a high resolution display, such as a 4K display, a 5K display, a 6K display, or an 8K display. The display may have a horizontal dimension greater than a vertical dimension and the horizontal dimension of the display may have about 4000 pixels (4K), about 5000 pixels (5K), 6000 pixels (6K), or about 8000 pixels (8K). For example, a display may have a pixel count in the horizontal direction greater than about 3800 pixels, greater than about 5000 pixels, greater than about 6000 pixels, or greater than about 7800 pixels.

A diagonal dimension of the display may be used as one measure of the size of the display. The display may be appropriately sized for the electronic device. In some embodiments, the diagonal dimension of the display may be from about 4 to about 10 inches (about 10 cm to about 25 cm), about 10 inches to about 20 inches (about 25 cm to about 50 cm), about 20 inches to about 50 inches (about 50 cm to about 125 cm), or about 50 inches to about 100 inches (about 125 cm to about 250 cm).

The pixel density may depend on the size of the display. For example, the pixel density may decrease as the size of the display increases. The pixel density may be greater than 50 ppi, greater than 130 ppi, greater than 200 ppi, or greater than 300 ppi. In some embodiments, the pixel density may be from 300 ppi to 2000 ppi, from 200 ppi to 1000 ppi, from 130 ppi to 350 ppi, or from 50 ppi to 100 ppi.

The textured region 223 of the cover assembly 222 and/or the glass cover member 252 may also be configured to provide particular optical properties. The optical properties may be due, at least in part, to the texture parameters of the surface structures and/or surface features as described herein. In addition, the textured region 223 and/or the glass cover member 252 may be configured to provide particular combinations of optical properties. For example, the textured region 223 may be configured to provide a combination of two or more of diffuse reflection or reflective haze, transmissive haze, clarity, transmission, reflectance, or sparkle. In some embodiments, the textured region 223 may be configured to provide a combination of diffuse reflection or reflective haze and transmissive haze or clarity. Some optical properties (e.g. optical properties related to transmission of light though the glass cover member or cover assembly) may be measured for the glass cover member or cover member in "isolation" (when removed from the electronic device). Additional optical properties may be measured for the cover assembly as placed over the display.

For example, an anti-glare property of the textured region 223 of the glass cover member 252 may be measured by its reflective haze or extent of diffuse reflection, also referred to as the diffuse reflectance. The reflective haze or extent of diffuse reflection may be measured using commercially available equipment. As a non-limiting example, the reflective haze or extent of diffuse reflection may be measured using a SMS-1000 available from DM&S (Display-Messtechnik & Systeme). The extent of diffuse reflection or reflective haze may be greater than or equal to about 5%, greater than or equal to about 10%, or greater than or equal to about 15%. In some embodiments, the extent of diffuse reflection or reflective haze may be measured for a cover assembly placed over the display.

An anti-reflection property of the textured region 223 may be determined from its reflectance spectrum of a specified range of wavelengths, such as the visible spectrum of light (e.g., from about 380 nm to about 750 nm), also referred to as the visible spectrum. A reflectance of the textured region of the cover assembly may be less than about 10%, less than or equal to about 5%, less than or equal to about 4%, less than or equal to about 3%, less than or equal to about 2%, or less than or equal to about 1% as integrated across the visible spectrum. These reflectance values may also be referred to as the (average) photopic reflectance. In some embodiments, the photopic reflectance may be measured for the cover assembly in isolation. The photopic reflectance may be measured using commercially available equipment.

In addition, coordinates in CIEL*a*b* (CIELAB) color space may be used to characterize a color of the textured region 223. In CIEL*a*b* (CIELAB) color space, L* represents brightness, a* the position between red/magenta and green, and b* the position between yellow and blue. A broadband or semi-broadband illuminant may be used to determine the color of the textured region. For example, a CIE illuminant or other reference illuminant may be used. When the anti-reflection coating has a neutral reflectance, the absolute value of each of a* and b* may be less than 5, less than 3, or less than or equal to 2. The color of the textured region 223 may be determined from the light reflected at a particular viewing angle (e.g., a viewing angle approximately aligned with or at an angle to the direction of incident light).

The efficiency of light transmission of the textured region 223 or of the glass cover member 252 may be measured using commercially available equipment and according to ASTM or ISO standard test methods. As a non-limiting example, the efficiency of light transmission (e.g., total transmission) may be measured using a haze-gard i device available from BYK. The efficiency of light transmission may be greater than about 75%, greater than about 80%, greater than or equal to about 90%, or greater than or equal to about 95%. The efficiency of light transmission may be measured for the cover assembly or glass cover member in isolation.

The transmissive haze of the textured region 223 or of the glass cover member 252 may be measured using commercially available equipment and according to ASTM or ISO standard test methods. The transmissive haze may be less than or equal to about 60%, less than or equal to about 50%, less than or equal to about 40%, or less than or equal to about 30%. The transmissive haze may relate to the amount of light subject to wide angle scattering (e.g., greater than 2.5 degrees). The transmissive haze may relate to the perceived contrast, with greater amounts of wide angle scattering producing reduced contrast. As non-limiting examples, the transmissive haze or the transmissive narrow angle scattering may be measured using a haze-gard i device available from BYK or a GC 5000L variable photometer available from Nippon Denshoku. The transmissive haze may be measured for the cover assembly or glass cover member in isolation.

The transmissive narrow angle scattering and the clarity of the textured region 223 or of the glass cover member 252 may be measured using commercially available equipment and according to ASTM or ISO standard test methods. The transmissive narrow angle scattering and clarity may relate to the amount of light subject to narrow angle scattering (e.g., smaller than 2.5 degrees). The transmissive narrow angle scattering may relate to the perceived clarity and sharpness, with greater amounts of narrow angle scattering producing reduced clarity and sharpness. The clarity may be greater than or equal to about 40%, greater than or equal to about 50%, or greater than or equal to about 60%. A clarity value may be determined from measurements of the intensity in a central region ($I_{central}$) and an intensity in a ring around the central region ($I_{ring}$). For example, the clarity value may be equal to $100\%*(I_{central}-T_{ring})/(I_{central}+I_{ring})$. As non-limiting examples, the clarity or the transmissive narrow angle scattering may be measured using a haze-gard i device available from BYK or a GC 5000L variable photometer available from Nippon Denshoku.

The luminance and color spatial uniformity of the cover assembly 222 or of the glass cover member 252 may be characterized by measuring a sparkling effect. The sparkling effect (also referred to herein as sparkling or sparkle) can be measured using commercially available equipment. As a non-limiting example, the sparkle may be measured using a SMS-1000 available from DM&S. The sparkle may be less than or equal to about 20%, less than or equal to about 10%, or less than or equal to about 5%. In some embodiments, the sparkle may be measured for a cover assembly placed over the display (with or without the optional diffractive layer described with respect to FIG. 3).

Figure 3:
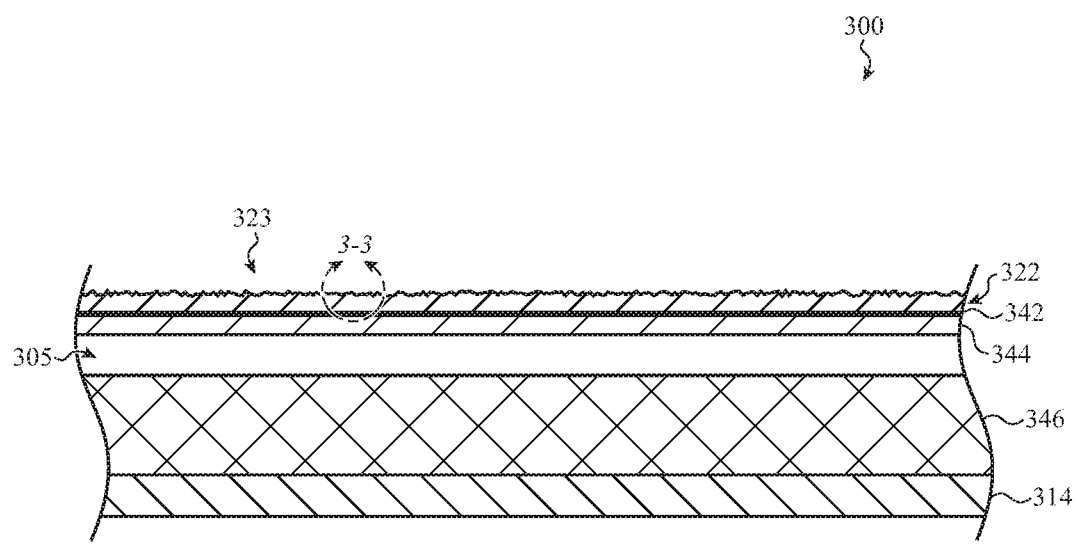
FIG. 3 shows another example of a cross-section view of an electronic device.

FIG. 3 shows an example of a cross-section view of an electronic device 300, which may be an example of the electronic device of FIG. 1. The cross-section may be taken along A-A in detail area 1-1. As shown in FIG. 3, the cover assembly 322 has a textured region 323.

A display 344 is provided below the cover assembly 322 and a diffractive layer 342 is provided between the cover assembly 322 and the display 344. The electronic device 300 further includes a housing component 314, which may define a rear surface of the electronic device 300. Additional components, schematically indicated by the element 346, may also be included within the interior volume 305 of the electronic device 300.

The cover assembly 322 may be an embodiment of the cover assembly 222 of FIG. 2A or any other cover assemblies described herein. Details of these cover assemblies are applicable to the cover assembly 322 and, for brevity, will not be repeated here.

The diffractive layer may comprise a grating structure configured to project multiple images of a pixel of the display. The multiple images may correspond to light generated by the pixel. For example, the pixel may emit light and the grating structure may generate multiple bright "spots" based on the light emitted by the pixel. The multiple images of the pixel may be projected onto an interior surface of the glass cover member. Typically the grating structure is configured to project multiple images for each pixel of an array of pixels of the display.

When a pixel comprises subpixels, such as single color regions, the grating structure may also be configured to project multiple images of a subpixel. The multiple images of the subpixel may correspond to light generated by the subpixel. For example, the subpixel may emit light and the grating structure may generate multiple bright "spots" based on the light emitted by the subpixel. Typically the grating structure is configured to project multiple images for each subpixel of at least one pixel of the display.

Adjacent images of the multiple images of a pixel or subpixel may be offset by a distance less than a pixel or subpixel size of the display. In addition, adjacent images of the multiple images may be offset by a distance less than the average pitch of peaks of the textured region. As example, adjacent images of the multiple images may be offset from about 0.5 microns to about 15 microns, from about 1 micron to about 10 microns, or from about 1 micron to about 5 microns.

Figure 4:
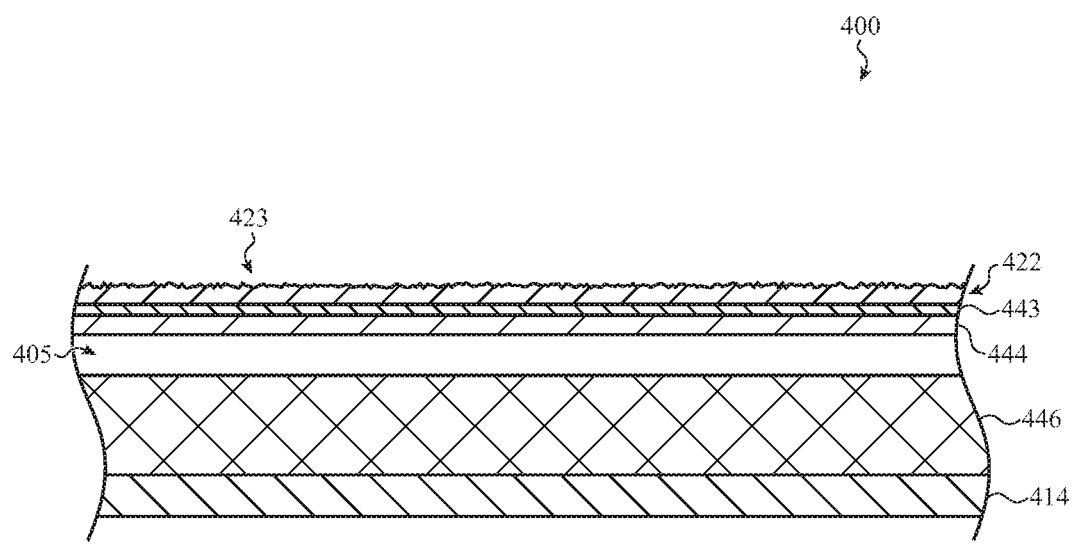
FIG. 4 shows a further example of a cross-section view of an electronic device.

FIG. 4 shows an example of a cross-section view of an electronic device 400, which may be an example of the electronic device of FIG. 1. The cross-section may be taken along A-A in detail area 1-1. As shown in FIG. 4, the cover assembly 422 has a textured region 423. A display 444 is positioned below the cover assembly 422 and a touch sensitive layer 443 is positioned between the cover assembly 422 and the display 444. The electronic device 400 further includes a housing component 414, which may define a rear surface of the electronic device 400. Additional components, schematically indicated by the element 446, may also be included within the interior volume 405 of the electronic device 400.

The cover assembly 422 may be an embodiment of the cover assembly 222 of FIG. 2A or any other cover assemblies described herein. Details of these cover assemblies are applicable to the cover assembly 422 and, for brevity, will not be repeated here.

The touch sensitive layer 443 may comprise a touch sensor configured to detect a touch or a touch input along the textured region 423. The touch sensitive layer may include a capacitive sensor or one or more components of a capacitive touch sensor. For example, the touch sensor may comprise an array of electrodes that are configured to detector estimate a location of a touch along an exterior surface of the cover assembly. In some cases, the enclosure may include a diffractive layer in addition to the touch-sensitive layer. The diffractive layer may be as previously shown and described with respect to FIG. 3. In some cases, the diffractive layer may be placed between the touch-sensitive layer and the display.

Figure 5:
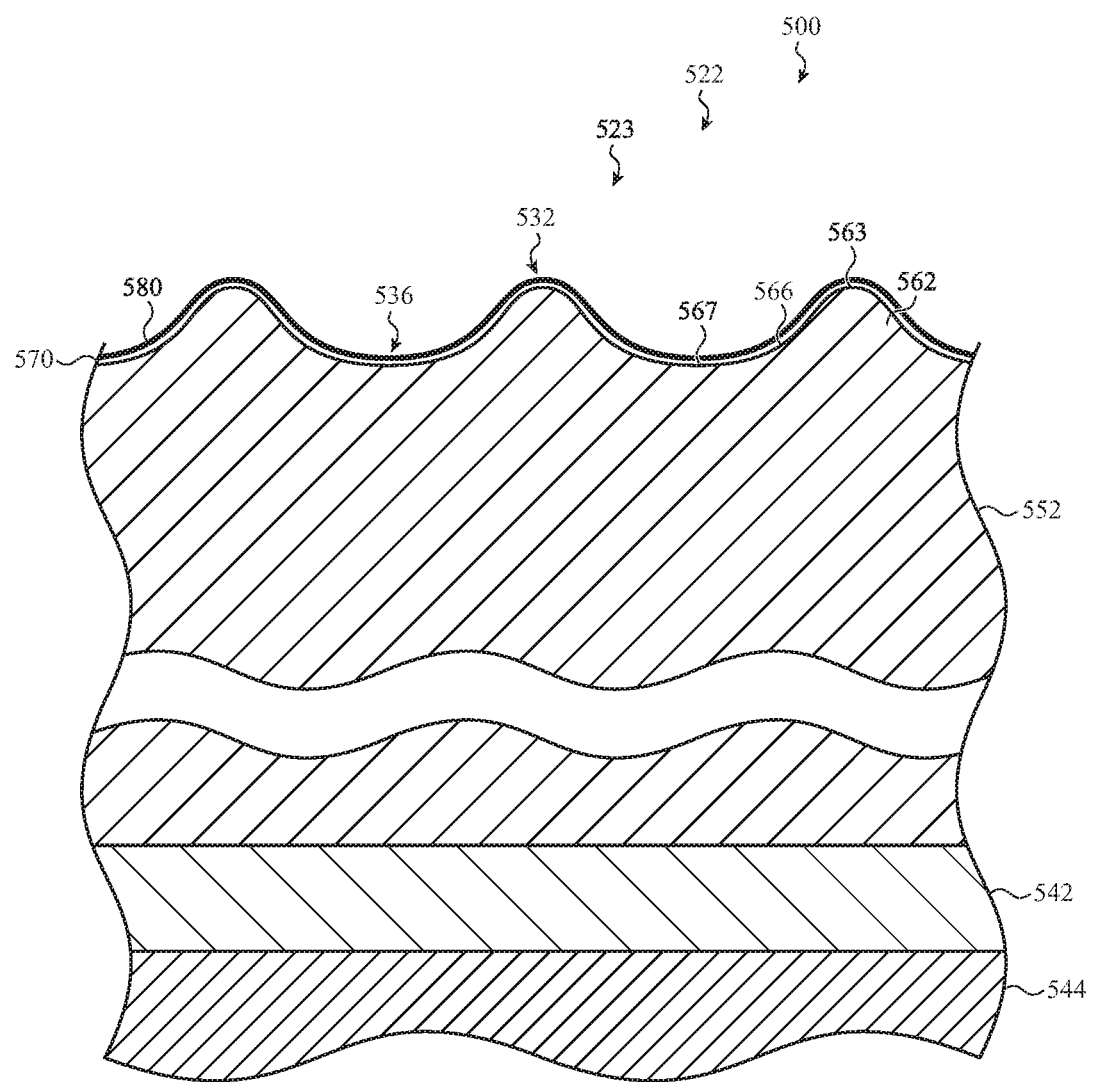
FIG. 5 shows a cross-section view of an example of a cover assembly.

FIG. 5 shows a cross-section view of an example of a cover assembly 522 of an electronic device 500. The electronic device 500 may be an example of the electronic device 300 shown in FIG. 3 and FIG. 5 may show an example of detail area 3-3. The cover assembly 522 has a textured region 523 and includes a glass cover member 552, an anti-reflection coating 570, and a smudge resistant coating 580. The electronic device 500 also comprises a display 544 and a diffractive layer 542 between the display 544 and the cover assembly 522.

The cover assembly 522 and the glass cover member 552 may be an embodiment of the cover assembly 222 and the glass cover member 252 of FIGS. 2A-2B or any other cover assemblies and glass cover members described herein. Details of these cover assemblies and glass cover members are applicable to the cover assembly 522 and the glass cover member 552 and, for brevity, will not be repeated here. The scale of FIG. 5 is exaggerated as compared to FIGS. 2A, 3, and 4 in order to better illustrate the surface features.

As shown in FIG. 5, the glass cover member 552 defines surface features, such as hill features 562 and valley features 566. Each hill feature 562 may be characterized by a peak 563 located at a maximum point of the hill feature 562. Similarly, each valley feature 566 may be characterized by a minimum point 567. In some embodiments, the glass cover member 552 may define an irregular set of hills and valleys. The irregular set of hills and valleys may have an irregular spacing, such as a non-uniform spacing or a distribution of spacing values, between hill features, valley features, or a combination thereof. The set of hills and valleys may have a random or pseudorandom distribution of spacing values. As shown in FIG. 5, a thickness of the anti-reflection coating 570 over the hill feature 562 is about equal to a thickness of the anti-reflection coating over the valley feature 566. For example, the variation in the thickness of the anti-reflection coating 570 may be less than or equal to about 10%, less than or equal to about 5%, less than or equal to about 3%, or less than or equal to about 2%.

The textured region 523 includes the surface structures 532 and 536, with the surface structure 532 corresponding to a hill feature (e.g., hill feature 562) and the surface structure 536 corresponding to a valley feature (e.g., valley feature 566). Therefore, the surface structure 532 may be a hill structure and the surface structure 536 may be a valley structure.

The anti-reflection coating may be as previously described with respect to FIG. 2B. The smudge resistant coating, which may also be referred to herein as an oleophobic coating, may comprise a fluorinated material. Smudge-resistant coatings are described in further detail with respect to FIG. 12E and that description is generally applicable to the smudge-resistant coatings described herein.

Figure 6:
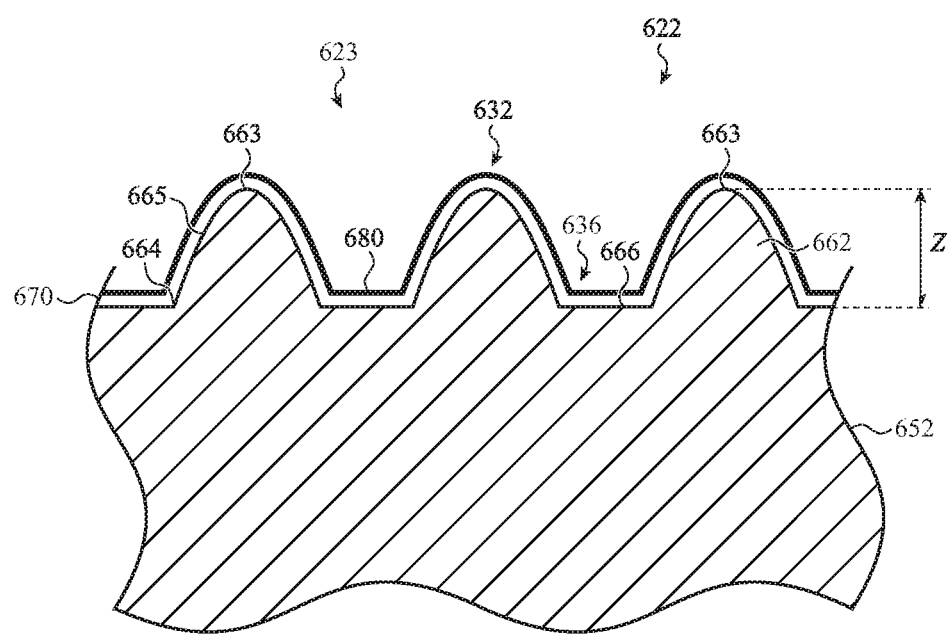
FIG. 6 shows a cross-section view of another example of a cover assembly.

FIG. 6 shows a cross-section view of an example of a cover assembly 622. The cover assembly 622 has a textured region 623 and includes a glass cover member 652, an anti-reflection coating 670, and a smudge resistant coating 680.

The cover assembly 622 and the glass cover member 652 may be an embodiment of the cover assembly 222 and the glass cover member 252 of FIGS. 2A-2B or any other cover assemblies and glass cover members described herein. Details of these cover assemblies and glass cover members are applicable to the cover assembly 622 and the glass cover member 652 and, for brevity, will not be repeated here. The scale of FIG. 6 is exaggerated as compared to FIGS. 2A, 3, and 4 in order to better illustrate the surface features.

As shown in FIG. 6, the glass cover member 652 defines a substrate surface 666 and surface features in the form of protrusions 662 which extend outwardly from the substrate surface 666. The surface features 662 define a base 664, a top 663, and an inclined surface 665 that extends from the base 664 towards the peak 663. The peak 663 has a height Z above the substrate surface 666.

As shown in FIG. 6, at least two adjacent surface features 662 are set apart from one another along the substrate surface 666 such that a span of the substrate surface 666 is exposed between the adjacent surface features 662. The span of the substrate surface 666 between adjacent surface features 662 may define a level (flat) or substantially level (flat) region of the exterior surface of the glass cover member.

The cover assembly 622 further comprises the surface structures 632 and 636, corresponding respectively to the protrusions 662 and to the level regions of the substrate surface 666. As shown in FIG. 6, the thickness of the anti-reflection coating 670 over the protrusions 662 is about equal to a thickness of the anti-reflection coating 670 over the level regions of substrate surface 666.

In additional embodiments, a glass cover member may define a substrate surface and surface features in the form of negative features (e.g., recesses) which extend inwardly from the substrate surface. The span of the substrate surface between adjacent recesses may define a level (flat) or substantially level region of the exterior surface of the glass cover member or the substrate may define hills or peaks between recesses as shown in FIGS. 5 and 8. The cover assembly may also include surface structures corresponding to recesses formed in the glass cover member and to the substrate surface.

FIG. 7 shows a cross-section view of an example of a cover assembly 722. The cover assembly 722 has a textured region 723 and includes a glass cover member 752, an anti-reflection coating 770, and a smudge-resistant coating 780.

The cover assembly 722 and the glass cover member 752 may be an embodiment of the cover assembly 222 and the glass cover member 252 of FIGS. 2A-2B or any other cover assemblies and glass cover members described herein. Details of these cover assemblies and glass cover members are applicable to the cover assembly 722 and the glass cover member 752 and, for brevity, will not be repeated here. The scale of FIG. 7 is exaggerated as compared to FIGS. 2A, 3, and 4 in order to better illustrate the surface features.

The glass cover member 752 defines a substrate surface 766 and surface features 762 in the form of protrusions which extend outwardly from the substrate surface 766. The surface features 762 define a base 764, a top 763, and a curved surface 765 that extends from the base 764 towards the peak 763. The curved surface 765 has a convex shape.

The cover assembly 722 further comprises surface structures 732 and 736, corresponding respectively to the surface features 762 and 766. As shown in FIG. 7, the thickness of the anti-reflection coating 770 over the surface features 762 is about equal to a thickness of the anti-reflection coating 770 over the substrate surface 766.

FIG. 8 shows a cross-section view of a further example of a cover assembly 822. The cover assembly 822 has a textured region 823 and includes a glass cover member 852, an anti-reflection coating 872, and a smudge-resistant coating 880.

The cover assembly 822 and the glass cover member 852 may be an embodiment of the cover assembly 222 and the glass cover member 252 of FIGS. 2A-2B or any other cover assemblies and glass cover members described herein. Details of these cover assemblies and glass cover members are applicable to the cover assembly 822 and the glass cover member 852 and, for brevity, will not be repeated here. The scale of FIG. 8 is exaggerated as compared to FIGS. 2A, 3, and 4 in order to better illustrate the surface features.

As shown in FIG. 8, the glass cover member 852 may define two different types of surface features. The first type of surface features typically has a size, such as a lateral dimension and/or a height, which is greater than that of the second type of surface features. The second surface features may be formed on the first surface features. As shown in FIG. 8, the first type of surface features includes a recess 866 and a protrusion 862, with the protrusion 862 defining a peak 863. The second type of surface features includes recesses 874. It should be appreciated that the shapes of the first and the second types of surface features are not limited to those shown in FIG. 8 and may be any of the surface features described herein. The first type of surface features may form a first set of surface features and the second type of surface features may form a second set of surface features.

The second surface features may be configured to provide a different function or property than the first surface features. For example, the second surface features may be configured to provide an anti-reflection effect. In the example of FIG. 8, both the anti-reflection layer 872 and the second surface features 874 may provide an anti-reflection effect. However, in further embodiments the anti-reflection layer 872 may be omitted and the second surface features 874 may provide the sole anti-reflection effect.

The size of the second surface features 874 may cause anti-reflection effect by providing an effective index of refraction or a graded refractive index (GRIN) structure. The second surface features may have a size less than the shortest wavelength of visible light (e.g., less than about 380 nm), such as less than about 350 nm. In some cases, the second surface features are nano-scale features. As used herein, nano-scale may refer to sizes from about 1 nm to about 1 micron (typically less than 1 micron). The second surface features may have a width from about 5 nm to about 100 nm or from about 5 nm to about 50 nm and a depth from about 5 nm to about 100 nm or from about 5 nm to about 50 nm. As shown in FIG. 8, the anti-reflection layer 872 may at least partially fill the recesses 874. In some examples, the exterior surface of the anti-reflection layer 872 may have some extent of nano-scale roughness due to the underlying nano-scale features 874. The cover assembly 822 further comprises the surface structures 832 and 836, corresponding respectively to the protrusions 862 and the recesses 866.

Figure 9:
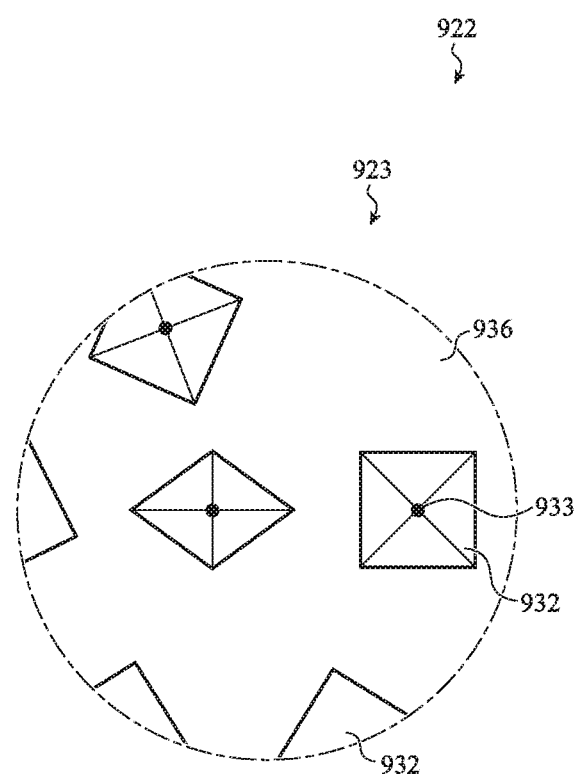
FIG. 9 shows a top view of an example of a cover assembly.

FIG. 9 shows a top view of an example of a cover assembly 922. The cover assembly 922 has a textured region 923. The cover assembly 922 may be an embodiment of the cover assembly 222 of FIG. 2A or any other cover assemblies described herein. Details of these cover assemblies are applicable to the cover assembly 922 and, for brevity, will not be repeated here. The scale of FIG. 9 is exaggerated as compared to FIGS. 2A, 3, and 4 in order to better illustrate the surface structures.

FIG. 9 shows that the textured region 923 includes surface structures 932 which extend outwardly (or protrude) with respect to surface structure 936. As shown in FIG. 9, the surface structures 932 may define at least a portion of a pyramid. Each of the surface structures 932 may define a base that defines a polygonal contour and an inclined surface extending generally outward from the base towards peak 933. The inclined surface may define a plurality of facets, as schematically shown in FIG. 9. The inclined surface may define an internal taper angle from about 90 degrees to about 120 degrees between opposing regions of the inclined surface. Each of the surface structures 936 may define a substantially level region extending between surface structures 932. A cross-section of the surface structures 932 may appear similar to that of the surface features 632 of FIG. 6. In additional embodiments, the inclined surface may define a convex shape (as shown in FIG. 7).

The cover assembly 922 may include a glass cover member which defines surface features underlying and corresponding to the surface structures 932 and 936. The surface features of the glass cover member corresponding to the protruding surface structures 932 may include protruding surface features defining a generally polygonal contour and an inclined surface extending generally outward from the base towards a peak. The surface features of the glass cover member corresponding to the surface structures 936 may define a substantially level region extending between protruding surface features. As previously described with respect to FIGS. 2A-2B, the surface structures of the textured region 923, such as the surface structures 932 and 936, may include an anti-reflection coating and may further include the smudge-resistant coating.

Figure 10:
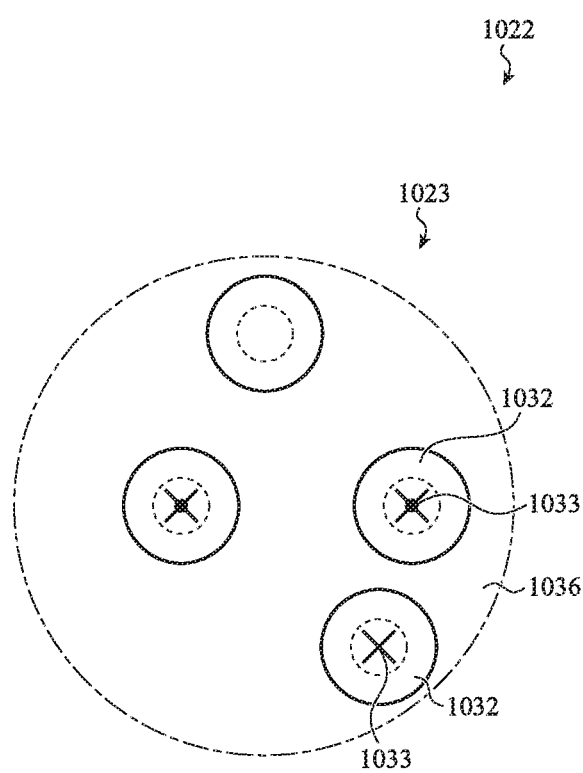
FIG. 10 shows a top view of another example of a cover assembly.

FIG. 10 shows a top view of another example of a cover assembly 1022. The cover assembly 1022 has a textured region 1023. The cover assembly 1022 may be an embodiment of the cover assembly 222 of FIG. 2A or any other cover assemblies described herein. Details of these cover assemblies are applicable to the cover assembly 1022 and, for brevity, will not be repeated here. The scale of FIG. 10 is exaggerated as compared to FIGS. 2A, 3, and 4 in order to better illustrate the surface structures.

FIG. 10 shows that the textured region 1023 includes surface structures 1032 which extend outwardly (or protrude) with respect to the surface structure 1036. As shown in FIG. 10, the surface structures 1032 may define at least a portion of a cone. Each of the surface structures 1032 may define a base that defines a generally circular contour and an inclined surface extending generally outward from the base towards peak 1033. Each of the structures 1036 may define a substantially level region extending between the structures 1032. A cross-section of the surface structures 1032 may appear similar to that of the surface features 632 of FIG. 6.

The cover assembly 1022 may include a glass cover member which defines surface features underlying and corresponding to the surface structures 1032 and 1036. The surface features of the glass cover member corresponding to the protruding surface structures 1032 may include protruding features defining a generally circular contour and an inclined surface extending generally outward from the base towards a peak. The surface features of the glass cover member corresponding to the surface structures 1066 may define a substantially level region extending between protruding surface features. As previously described with respect to FIG. 2B, the surface structures of the textured region 1023, such as the surface structures 1032 and 1036, may include an anti-reflection coating and may further include the smudge-resistant coating.

Figure 11:
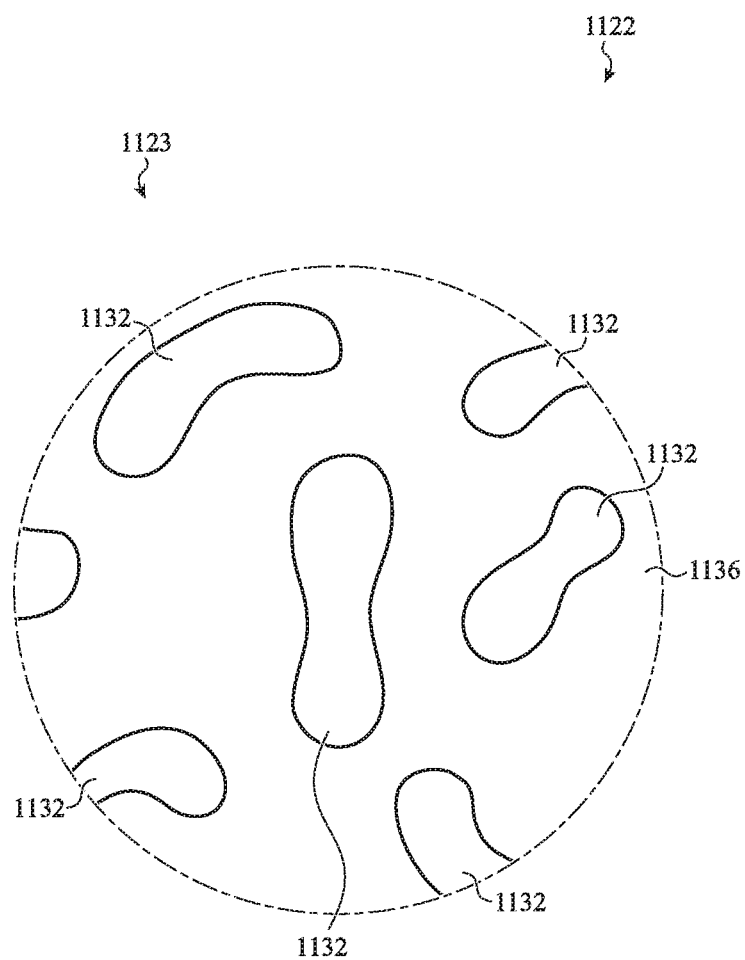
FIG. 11 shows a top view of an additional example of a cover assembly.

FIG. 11 shows a top view of an additional example of a cover assembly 1122. The cover assembly 1122 has a textured region 1123. The cover assembly 1122 may be an embodiment of the cover assembly 222 of FIG. 2A or any other cover assemblies described herein. Details of these cover assemblies are applicable to the cover assembly 1122 and, for brevity, will not be repeated here. The scale of FIG. 11 is exaggerated as compared to FIGS. 2A, 3, and 4 in order to better illustrate the surface structures.

As shown in FIG. 11, the surface structures of the textured region 1123 may include hill structures 1132 and valley structures 1136. The valley structures 1136 are located between adjacent hill structures 1132. The depths of the valley features 1136 are not visible in the top view of FIG. 11. At least some of the hill structures 1132 shown in FIG. 11 are elongated (e.g., not substantially circular when viewed from above the features).

As shown in FIG. 11, the textured region 1123 has a non-uniform spacing between adjacent hill structures 1132 and adjacent valley structures 1136. Therefore, the hill structures 1132 and the valley structures 1136 are not arranged in a regular array. Because the hill and the valley structures are non-uniformly spaced, the overall appearance of the textured region 1123 may lack a visually apparent pattern (e.g., a pattern of lines, striations, swirls, a grid, etc.).

The cover assembly 1122 may include a glass cover member which defines surface features underlying and corresponding to the hill structures 1132 and the valley structures 1136. For example, the glass cover member may define a set of hill features and valley features corresponding to a set of surface structures defined by the textured region 1123 of the cover assembly 1122. The corresponding surface features of the glass cover member may be hill features and valley structures similar to those previously described with respect to FIG. 5.

Figure 12A:
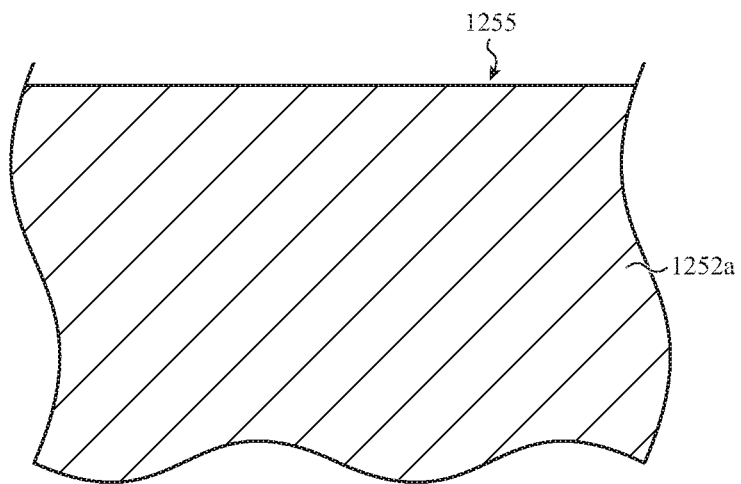
FIGS. 12A, 12B, 12C, 12D, and 12E schematically illustrate stages in a process of making a cover assembly.
Figure 12B:
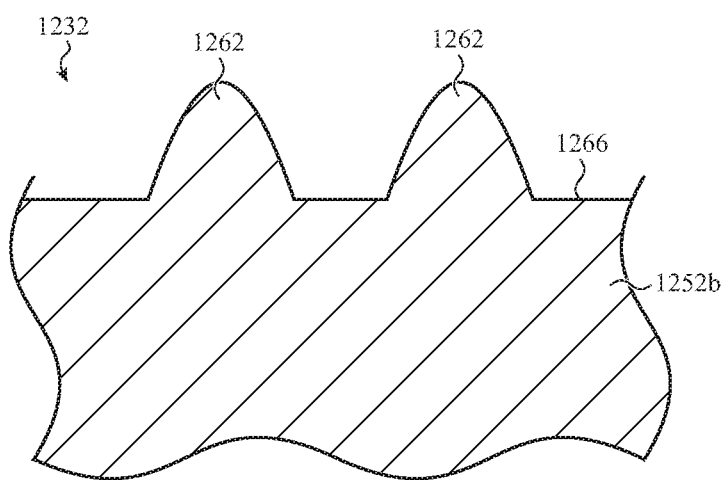
Figure 12C:
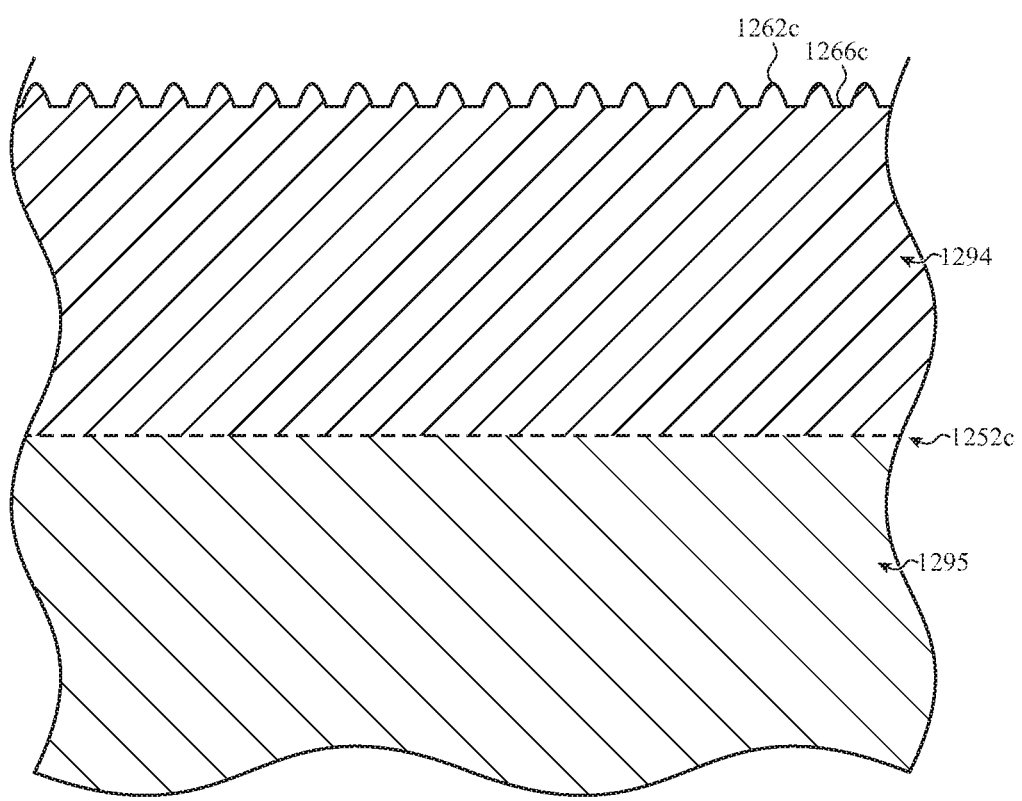
Figure 12D:
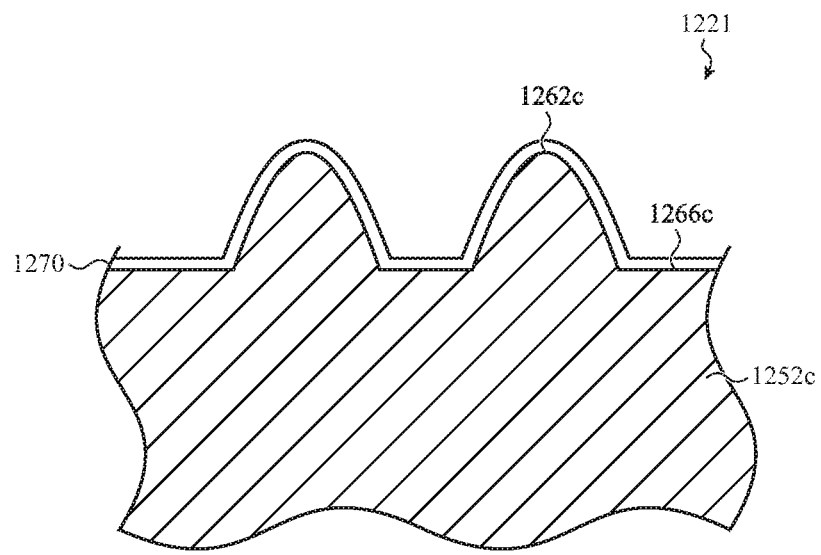
Figure 12E:
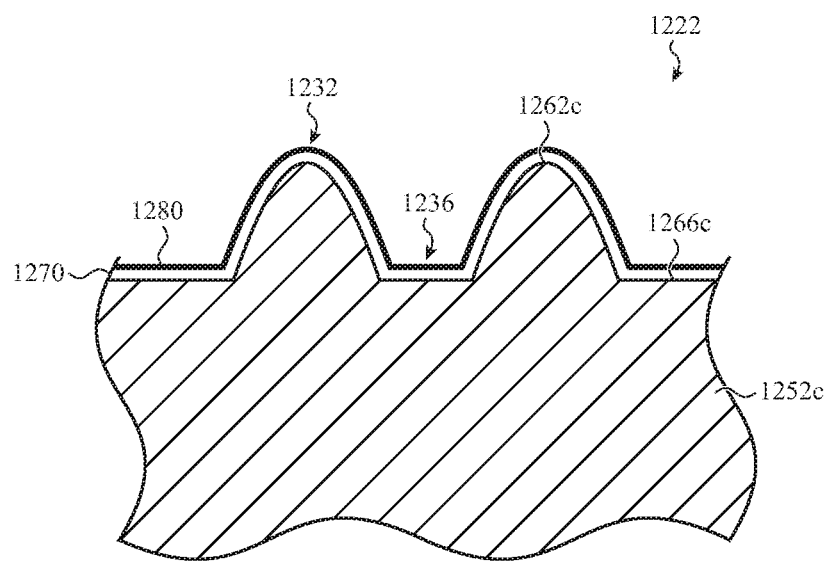

FIGS. 12A, 12B, 12C, 12D, and 12E schematically illustrate stages in a process of making a cover assembly (e.g., cover assembly 1222 of FIG. 12E). The cover assembly 1222 and the glass cover members 1252a, 1252b, and 1252c may be embodiments of the cover assembly 222 and the glass cover member 252 of FIGS. 2A-2B or any other cover assemblies and the glass cover members described herein. Details of these cover assemblies and glass cover members are applicable to the cover assemblies 1221 and 1222 and the glass cover members 1252a-1252c and, for brevity, will not be repeated here. The scale of FIGS. 12A-E is exaggerated as compared to FIGS. 2A, 3, and 4 in order to better illustrate the surface features. FIG. 12A schematically shows a glass cover member 1252a prior to forming surface features along an external surface 1255. Although the glass cover member 1252a is shown in FIG. 12A as being substantially planar, the principles described herein also relate to glass cover members including one or more curved surfaces. In embodiments, the glass cover member may be three-dimensional. For example, the glass cover member may define a peripheral portion that is not coplanar with respect to a central portion. The peripheral portion may, for example, define a side wall of a device housing or enclosure, while the central portion defines a front surface (which may define a transparent window that overlies a display).

The glass cover member 1252a, as well as glass cover members 1252b and 1252c, may comprise a glass material. The glass material may be a metal oxide-based material such as a silica-based material. The glass material of the glass cover member may have a network structure, such as a silicate-based network structure. For example, the glass material may comprise an aluminosilicate glass or a boroaluminosilicate glass. As used herein, an aluminosilicate glass includes the elements aluminum, silicon, and oxygen, but may further include other elements. Similarly, a boroaluminosilicate glass includes the elements boron, aluminum, silicon, and oxygen, but may further include other elements. For example, an aluminosilicate glass or a boroaluminosilicate glass may further include monovalent or divalent ions which compensate charges due to replacement of silicon ions by aluminum ions. Suitable monovalent ions include, but are not limited to, alkali metal ions such as $Li^+$, $Na^+$, or $K^+$. Suitable divalent ions include alkaline earth ions such as $Ca^{2+}$ or $Mg^{2+}$. The glass material of the glass cover member may be ion exchangeable.

FIG. 12B schematically illustrates the result of an operation of forming surface features in the glass cover member 1252a of FIG. 12A. The resulting glass cover member 1252b has a textured region 1232 that includes surface features 1262 and 1266. The shapes of the surface features 1262 and 1266 are not limited to those of FIG. 12B, but may be any surface features as described herein. For example, the surface features may define protrusions, recesses, flat portions, or combinations thereof.

In some embodiments, the surface features 1262 and 1266 may be formed by removing a portion of the glass cover member 1252a. Techniques for removing material from a glass cover member include, but are not limited to, chemical etching, laser ablation, mechanical removal of material, mechanical pre-treatment followed by etching, lithography in combination with etching, and combinations thereof. For example, a surface of the glass cover member may be blasted with abrasive particles to form pits or other such features in the surface of the glass cover member. The surface of the glass cover member may then be chemically etched. Chemical etching techniques for glass cover members may involve using a suitable acid or base (e.g., a hydrofluoric acid-based etchant) to remove portions of the glass cover member. The chemical etching may occur in the liquid phase or in a gas phase. Etching techniques also include reactive ion etching, which may use a mixture of a fluorine containing compound such as $CH_4$, $CHF_3$, $SF_6$ and the like in a gas such as argon or xenon. Reactive ion etching may be combined with lithography.

The process of making a cover assembly may further include an operation of chemically strengthening the glass cover member. The operation of chemically strengthening the glass cover member may follow the operation of forming the surface features in the glass cover member and may precede an operation of applying an anti-reflection coating to the surface features.

FIG. 12C schematically illustrates the result of an operation of chemically strengthening the glass cover member 1252b of FIG. 12B. The resulting chemically strengthened glass cover member 1252c includes a compressive stress layer 1294. The depth of the compressive stress layer 1294 is schematically indicated by a dotted line in FIG. 12C. A tensile stress layer 1295 is created inward of the dotted line (below the dotted line as shown in FIG. 12C). The chemically strengthened glass cover member 1252c defines surface features 1262c and 1266c, which have been chemically strengthened. Surface features as referred to in the examples of FIGS. 1-11 may also be chemically strengthened as described herein.

The chemically strengthened glass cover member 1252c may be chemically strengthened by ion exchange. During the ion exchange, ions present in the glass material can be exchanged for larger ions to form a compressive stress layer extending from a surface of the glass cover member. For example, an ion-exchangeable glass material may include monovalent or divalent ions such as alkali metal ions (e.g., $Li^+$, $Na^+$, or $K^+$) or alkaline earth ions (e.g., $Ca^{2+}$ or $Mg^{2+}$) which may be exchanged for other alkali metal or alkaline earth ions. If the glass member comprises sodium ions, the sodium ions may be exchanged for potassium ions. Similarly, if the glass member comprises lithium ions, the lithium ions may be exchanged for sodium ions and/or potassium ions. In embodiments, the compressive stress layer extends to a depth (or thickness) in the glass substrate which is greater than a lowest depth of the surface texture.

In an example, the chemical strengthening process involves exposing a glass cover member to a medium containing the larger ions, such as by immersing the glass cover member in a bath containing the larger ions or by spraying or coating the glass with a source of the larger ions. For example, a salt bath comprising the ions of interest (e.g., a potassium nitrate bath) may be used for ion exchange. Suitable temperatures for ion exchange are above room temperature and are selected depending on process requirements. The ion exchange process may be conducted at a temperature below the strain point of the glass. The glass cover member may be cooled following the ion exchange operation. Depending on the factors already discussed above, a compression layer as deep as about 10-100 microns or about 10-75 microns, can be formed in the glass cover member. The surface compressive stress (CS) may be from about 300 MPa to about 1100 MPa. Optionally, the glass cover member is washed after the ion exchange.

In some embodiments a compressive stress layer is formed at each of the textured region and an interior surface of the glass cover member. A tensile stress layer may be formed between these compressive stress layers. The compressive stress layer may extend from the surface of hills and valleys of the textured region. The index of refraction in the compressive stress layer of the glass cover member may be affected by the ion exchange process.

FIG. 12D schematically shows a cover assembly 1221 formed by an operation of applying an anti-reflection coating 1270 to the surface features 1262c and 1266c of chemically strengthened glass cover member 1252c. The anti-reflection coating may comprise, consist essentially of, or consist of one or more layers of an inorganic dielectric material. For example, the anti-reflection coating may comprise a metal oxide or a metal nitride. Suitable metal oxides include, but are not limited to, a silicon oxide (e.g., $SiO_2$), niobium oxide (e.g., $Nb_2O_5$), titanium oxide (e.g., $TiO_2$), tantalum oxide (e.g., $Ta_2O_5$), zirconium oxide (e.g., $ZrO_2$), magnesium oxide (e.g., MgO), and the like. Suitable metal nitrides include, but are not limited to, silicon nitride ($SiN_x$), silicon oxynitride (e.g., $SiO_xN_y$) and the like. Typically, the layers of inorganic dielectric material are sufficiently transparent to visible light for use in a cover over a display. In some embodiments, a metal layer having a thickness sufficiently small to allow transmission of visible light may be used in the coating.

In some embodiments, the anti-reflection coating comprises at least one layer of a first inorganic dielectric material and at least one layer of a second inorganic dielectric material. The first inorganic dielectric material may have a first index of refraction and the second inorganic dielectric material may have a second index of refraction. The first index of refraction may be less than an index of refraction of the glass cover member, and the second index of refraction may be greater than the index of refraction of the glass cover member. By the way of example, the anti-reflection coating may form a stack in which the first inorganic dielectric material alternates with the second dielectric material.

In embodiments, an anti-reflection coating may be applied to the surface features 1262c and 1266c using a physical vapor deposition (PVD) technique. Physical vapor deposition techniques include, but are not limited to, sputtering and evaporation techniques. Physical vapor deposition can be used to deposit layers of different compositions. Each of the layers may have a thickness from about 50 nm to about 1 micron, from about 50 nm to about 500 nm, or from about 100 nm to about 500 micron. The layers may be substantially dense (e.g., substantially non-porous).

An anti-reflection coating may also be applied to the surface features 1262c and 1266c using a sol-gel technique. For example, a sol-gel technique can be used to form a layer, such as a silica-containing layer, by depositing a sol or an at least partially gelled sol (sol-gel) on a surface of the glass cover member. Deposition techniques include, but are not limited to, spin, spray, and dip coating. A gel may then be formed in the layer of the sol/sol-gel. The gelled product may be dried, sintered, calcined, and combinations thereof. Sol-gel techniques are capable of producing porous layer. In some embodiments, a porous layer may have a gradient in the index of refraction.

FIG. 12E schematically shows a cover assembly 1222 after an operation of applying a smudge-resistant coating 1280 on the anti-reflection coating 1270. The coating 1280 may provide resistance to oils and other deposits on the electronic component. The cover assembly 1222 defines a surface structure 1232 which comprises the surface feature 1262c, the anti-reflection coating 1270, and the coating 1280. The cover assembly 1222 further defines a surface structure 1236 which comprises the surface feature 1266c, the anti-reflection coating 1270, and the coating 1280. The surface features 1262c and 1266c are defined by the glass cover member 1252c as previously described.

For example, the coating 1280 may comprise a fluorinated material, such as a fluorinated oligomer or polymer, to impart oleophobic and/or hydrophobic properties. For example, the contact angle of an oil on the coating may be greater than or equal to about 65 degrees or about 70 degrees. As an additional example, the contact angle of water on the coating may be greater than or equal to 90 degrees. The fluorinated material may comprise a linear (non-branched) fluorinated molecule such as a linear fluorinated oligomer or a linear fluorinated polymer.

The coating 1280 including the fluorinated material may be thin relative to the thickness of the anti-reflection layer and the surface features 1262c and 1266c. The layer of the fluorinated material may be formed through a wet chemistry method (which may include a drying step) or by a vapor deposition method. In embodiments, the layer of the fluorinated material is from about 5 nm to about 20 nm thick or from about 10 nm to about 50 nm thick. The layer of the fluorinated material may be bonded directly to the anti-reflection layer or may be bonded to an intermediate adhesion layer.

Figure 13:
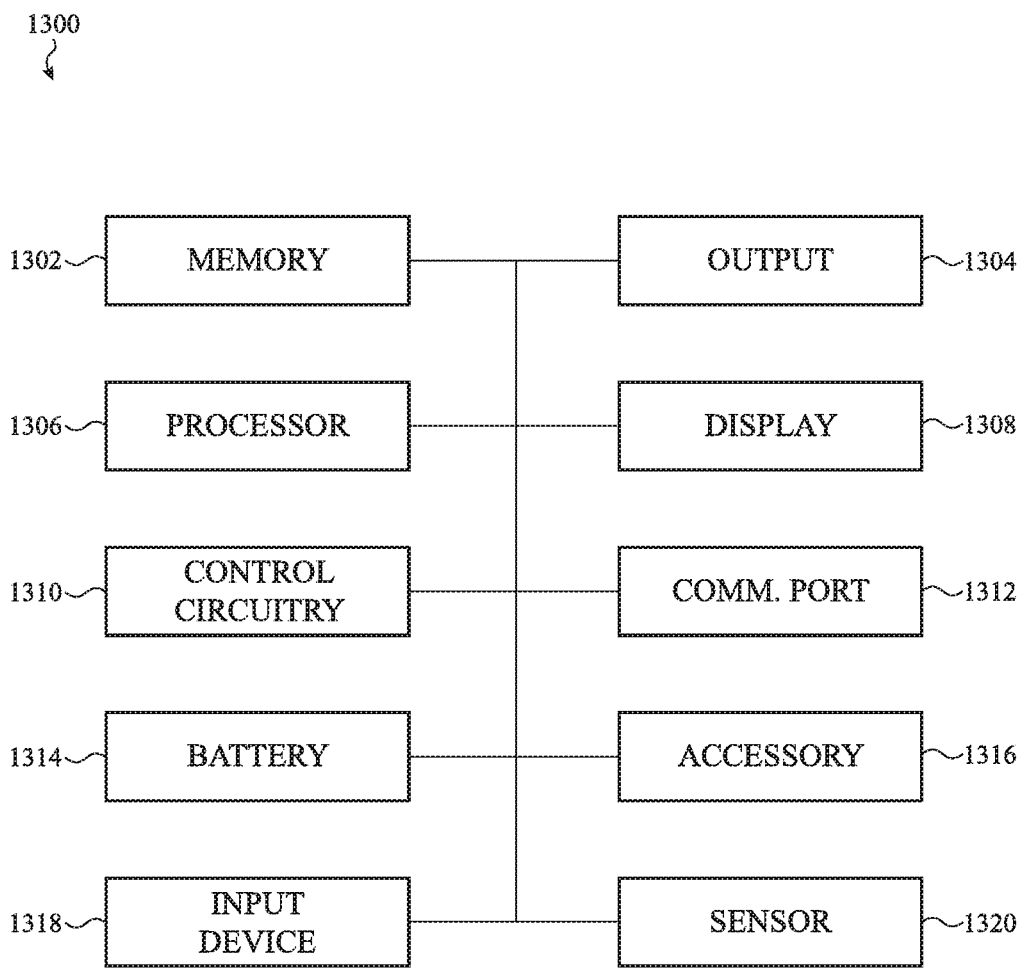
FIG. 13 shows a block diagram of a sample electronic device that can incorporate a cover assembly.

FIG. 13 shows a block diagram of a sample electronic device that can incorporate a textured cover assembly as described herein. The schematic representation depicted in FIG. 13 may correspond to components of the devices depicted in FIG. 1-12D as described above. However, FIG. 13 may also more generally represent other types of electronic devices with cover assemblies as described herein.

In embodiments, an electronic device 1300 may include sensors 1320 to provide information regarding configuration and/or orientation of the electronic device in order to control the output of the display. For example, a portion of the display 1308 may be turned off, disabled, or put in a low energy state when all or part of the viewable area of the display 1308 is blocked or substantially obscured. As another example, the display 1308 may be adapted to rotate the display of graphical output based on changes in orientation of the device 1300 (e.g., 90 degrees or 180 degrees) in response to the device 1300 being rotated.

The electronic device 1300 also includes a processor 1306 operably connected with a computer-readable memory 1302. The processor 1306 may be operatively connected to the memory 1302 component via an electronic bus or bridge. The processor 1306 may be implemented as one or more computer processors or microcontrollers configured to perform operations in response to computer-readable instructions. The processor 1306 may include a central processing unit (CPU) of the device 1300. Additionally, and/or alternatively, the processor 1306 may include other electronic circuitry within the device 1300 including application specific integrated chips (ASIC) and other microcontroller devices. The processor 1306 may be configured to perform functionality described in the examples above.

The memory 1302 may include a variety of types of non-transitory computer-readable storage media, including, for example, read access memory (RAM), read-only memory (ROM), erasable programmable memory (e.g., EPROM and EEPROM), or flash memory. The memory 1302 is configured to store computer-readable instructions, sensor values, and other persistent software elements.

The electronic device 1300 may include control circuitry 1310. The control circuitry 1310 may be implemented in a single control unit and not necessarily as distinct electrical circuit elements. As used herein, "control unit" will be used synonymously with "control circuitry." The control circuitry 1310 may receive signals from the processor 1306 or from other elements of the electronic device 1300.

As shown in FIG. 13, the electronic device 1300 includes a battery 1314 that is configured to provide electrical power to the components of the electronic device 1300. The battery 1314 may include one or more power storage cells that are linked together to provide an internal supply of electrical power. The battery 1314 may be operatively coupled to power management circuitry that is configured to provide appropriate voltage and power levels for individual components or groups of components within the electronic device 1300. The battery 1314, via power management circuitry, may be configured to receive power from an external source, such as an alternating current power outlet. The battery 1314 may store received power so that the electronic device 1300 may operate without connection to an external power source for an extended period of time, which may range from several hours to several days.

In some embodiments, the electronic device 1300 includes one or more input devices 1318. The input device 1318 is a device that is configured to receive input from a user or the environment. The input device 1318 may include, for example, a push button, a touch-activated button, capacitive touch sensor, a touch screen (e.g., a touch-sensitive display or a force-sensitive display), capacitive touch button, dial, crown, or the like. In some embodiments, the input device 1318 may provide a dedicated or primary function, including, for example, a power button, volume buttons, home buttons, scroll wheels, and camera buttons.

The device 1300 may also include one or more sensors 1320, such as a force sensor, a capacitive sensor, an accelerometer, a barometer, a gyroscope, a proximity sensor, a light sensor, or the like. The sensors 1320 may be operably coupled to processing circuitry. In some embodiments, the sensors 1320 may detect deformation and/or changes in configuration of the electronic device and be operably coupled to processing circuitry which controls the display based on the sensor signals. In some implementations, output from the sensors 1320 is used to reconfigure the display output to correspond to an orientation or folded/unfolded configuration or state of the device. Example sensors 1320 for this purpose include accelerometers, gyroscopes, magnetometers, and other similar types of position/orientation sensing devices. In addition, the sensors 1320 may include a microphone, acoustic sensor, light sensor, optical facial recognition sensor, or other types of sensing device.

In some embodiments, the electronic device 1300 includes one or more output devices 1304 configured to provide output to a user. The output device 1304 may include display 1308 that renders visual information generated by the processor 1306. The output device 1304 may also include one or more speakers to provide audio output. The output device 1304 may also include one or more haptic devices that are configured to produce a haptic or tactile output along an exterior surface of the device 1300.

The display 1308 may include a liquid-crystal display (LCD), light-emitting diode (LED) display, an LED-backlit LCD display, organic light-emitting diode (OLED) display, an active layer organic light-emitting diode (AMOLED) display, organic electroluminescent (EL) display, electrophoretic ink display, or the like. If the display 1308 is a liquid-crystal display or an electrophoretic ink display, the display 1308 may also include a backlight component that can be controlled to provide variable levels of display brightness. If the display 1308 is an organic light-emitting diode or organic electroluminescent-type display, the brightness of the display 1308 may be controlled by modifying the electrical signals that are provided to display elements. In addition, information regarding configuration and/or orientation of the electronic device may be used to control the output of the display as described with respect to input devices 1318. In some cases, the display is integrated with a touch and/or force sensor in order to detect touches and/or forces applied along an exterior surface of the device 1300.

The electronic device 1300 may also include a communication port 1312 that is configured to transmit and/or receive signals or electrical communication from an external or separate device. The communication port 1312 may be configured to couple to an external device via a cable, adaptor, or other type of electrical connector. In some embodiments, the communication port 1312 may be used to couple the electronic device to a host computer.

The electronic device 1300 may also include at least one accessory 1316, such as a camera, a flash for the camera, or other such device. The camera may be connected to other parts of the electronic device 1300 such as the control circuitry 1310.

As used herein, use of the term "about" in reference to the endpoint of a range may signify a variation of +/−5%, +/−2%, or +/−1% of the endpoint value. In addition, disclosure of a range in which at least one endpoint is described as being "about" a specified value includes disclosure of the range in which the endpoint is equal to the specified value.

The following discussion applies to the electronic devices described herein to the extent that these devices may be used to obtain personally identifiable information data. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. An electronic device comprising:
   a housing;
   a display positioned at least partially within the housing; and
   a cover assembly positioned over the display and coupled to the housing, the cover assembly having a textured region and including:
      a glass cover member having a surface defining hills and valleys configured to diffusely reflect visible light from the textured region, the hills defining a set of peaks having an average pitch between adjacent peaks of the set of peaks; and
a transparent inorganic coating covering the hills and the valleys and configured to produce destructive interference between the visible light reflected from the transparent inorganic coating and the visible light reflected from at least a portion of the hills and at least a portion of the valleys; and
a diffractive layer positioned between the cover assembly and the display and configured to project multiple images corresponding to light generated by a pixel of an array of pixels of the display with adjacent images of the multiple images offset by a distance less than the average pitch.

2. The electronic device of claim 1, wherein the textured region of the cover assembly has:
a diffuse reflectance greater than or equal to 10%; and
a transmissive haze less than or equal to 40%.

3. The electronic device of claim 1, wherein:
the average pitch is from 5 microns to 25 microns.

4. The electronic device of claim 1, wherein a reflectance of the textured region of the cover assembly is less than 10% integrated across a visible spectrum of light.

5. The electronic device of claim 1, wherein a thickness of the transparent inorganic coating over the hills and over the valleys is uniform to within 5%.

6. The electronic device of claim 1, wherein the glass cover member further comprises a compressive stress layer extending into the glass cover member from the surface defining the hills and the valleys.

7. An electronic device comprising:
a housing;
a cover assembly coupled to the housing and defining an exterior surface, the cover assembly comprising:
a glass cover member defining a set of surface features, the set of surface features having:
a root mean square height greater than zero and less than 2 microns; and
an average pitch greater than the root mean square height and less than 20 microns; and
a coating covering the set of surface features and comprising a plurality of inorganic dielectric layers configured to cause destructive interference between light reflected from the coating and light reflected from the glass cover member;
a display positioned below the cover assembly and configured to display a graphical output that is visible through the set of surface features and the coating; and
a diffractive layer positioned between the cover assembly and the display and configured so that the cover assembly in combination with the diffractive layer produces a sparkle less than or equal to 10%.

8. The electronic device of claim 7, wherein:
a thickness of the coating is uniform to within 10%;
a reflectance of a region of the cover assembly comprising the coating is less than 10% integrated across a visible spectrum of light; and
the cover assembly has a clarity greater than or equal to 40%.

9. The electronic device of claim 7, wherein:
the display has a resolution greater than 130 pixels per inch.

10. The electronic device of claim 7, wherein the plurality of inorganic dielectric layers include:

a first layer comprising a first inorganic dielectric material having a first index of refraction less than an index of refraction of the glass cover member; and
a second layer comprising a second inorganic dielectric material having a second index of refraction greater than the index of refraction of the glass cover member.

11. The electronic device of claim 7, wherein the coating has a thickness ranging from 100 nm to 500 nm.

12. The electronic device of claim 7, wherein the coating is configured to cause the exterior surface of the cover assembly to have a neutral reflectance over a visible spectrum of light.

13. The electronic device of claim 7, wherein:
the set of surface features is a first set of surface features; and
the glass cover member further defines a second set of surface features formed on the first set of surface features, each surface feature of the second set of surface features having a lateral dimension less than 350 nm.

14. The electronic device of claim 7, wherein an exterior surface of the glass cover member defines a level region between at least two adjacent surface features of the set of surface features.

15. An electronic device comprising:
a housing at least partially defining an interior volume of the electronic device;
a display positioned at least partially within the interior volume; and
a cover assembly positioned over the display and coupled to the housing, the cover assembly including:
a glass cover member defining:
a substrate surface; and
a set of protrusions extending outwardly from the substrate surface and arranged such that at least two adjacent protrusions of the set of protrusions are set apart from one another along the substrate surface, each protrusion of the set of protrusions having:
a width between 1 micron to 25 microns; and
a height greater than zero and less than 2 microns; and
an anti-reflection coating conforming to the set of protrusions and the substrate surface and comprising an inorganic dielectric material; and
a diffractive layer positioned between the cover assembly and the display and configured so that the cover assembly in combination with the diffractive layer has a sparkle less than or equal to 5%.

16. The electronic device of claim 15, wherein the cover assembly has:
a reflective haze greater than or equal to 10%; and
a transmissive haze is less than or equal to 40%.

17. The electronic device of claim 15, wherein the cover assembly has a transmission of greater than or equal to 90% over a visible spectrum.

18. The electronic device of claim 15, wherein the display has a pixel density of greater than 130 pixels per inch.

19. The electronic device of claim 15, wherein each protrusion of the set of protrusions defines a base, a peak, and an inclined surface extending from the base to the peak.

20. The electronic device of claim 15, wherein the electronic device further comprises a touch sensor positioned between the display and the cover assembly.

* * * * *